United States Patent
Ziemba et al.

(10) Patent No.: US 11,636,998 B2
(45) Date of Patent: Apr. 25, 2023

(54) NANOSECOND PULSER PULSE GENERATION

(71) Applicant: Eagle Harbor Technologies, Inc., Seattle, WA (US)

(72) Inventors: Timothy Ziemba, Bainbridge Island, WA (US); Ilia Slobodov, Seattle, WA (US); John Carscadden, Seattle, WA (US); Kenneth Miller, Seattle, WA (US); Morgan Quinley, Seattle, WA (US)

(73) Assignee: Eagle Harbor Technologies, Inc., Seattle, WA (US)

( * ) Notice: Subject to any disclaimer, the term of this patent is extended or adjusted under 35 U.S.C. 154(b) by 0 days.

(21) Appl. No.: 17/142,069

(22) Filed: Jan. 5, 2021

(65) Prior Publication Data

US 2021/0125812 A1   Apr. 29, 2021

Related U.S. Application Data

(63) Continuation of application No. 16/524,950, filed on Jul. 29, 2019, now Pat. No. 10,892,141, which is a
(Continued)

(51) Int. Cl.
*H01J 37/32* (2006.01)
*H01L 21/683* (2006.01)
(Continued)

(52) U.S. Cl.
CPC .. *H01J 37/32146* (2013.01); *H01J 37/32082* (2013.01); *H01J 37/32091* (2013.01); *H01J 37/32128* (2013.01); *H01J 37/32174* (2013.01); *H01J 37/32541* (2013.01); *H01J 37/32568* (2013.01); *H01J 37/32715* (2013.01); *H01L 21/6833* (2013.01); *H01L 21/68757* (2013.01); *H02M 3/33523* (2013.01); *H03K 3/57* (2013.01); *H03M 1/12* (2013.01); *H05K 7/20154* (2013.01); *H05K 7/20172* (2013.01);
(Continued)

(58) Field of Classification Search
CPC ............... H01J 37/321; H01J 37/32146; H01J 37/32128; H01J 37/32174; H01J 37/32211; H01J 37/32091; H01J 37/32532; H01J 3/32568; H05K 7/20509; H05K 7/20254; H05K 7/20281; H02M 3/33507; H02M 3/33523; H02M 3/33546; H02M 3/33553
See application file for complete search history.

(56) References Cited

U.S. PATENT DOCUMENTS 6,815,633 B1 * 11/2004 Chen .................... H01J 37/321
                                                    156/345.48
10,892,140 B2 * 1/2021 Ziemba .............. H05K 7/20509
(Continued)

*Primary Examiner* — Haissa Philogene

(57) ABSTRACT

Some embodiments include a high voltage pulsing power supply. A high voltage pulsing power supply may include: a high voltage pulser having an output that provides pulses with an amplitude greater than about 1 kV, a pulse width greater than about 1 μs, and a pulse repetition frequency greater than about 20 kHz; a plasma chamber; and an electrode disposed within the plasma chamber that is electrically coupled with the output of the high voltage pulser to produce a pulsing an electric field within the chamber.

20 Claims, 15 Drawing Sheets

Related U.S. Application Data continuation-in-part of application No. 16/523,840, filed on Jul. 26, 2019, now Pat. No. 10,892,140.

(60) Provisional application No. 62/789,523, filed on Jan. 8, 2019, provisional application No. 62/789,526, filed on Jan. 8, 2019, provisional application No. 62/717,523, filed on Aug. 10, 2018, provisional application No. 62/711,347, filed on Jul. 27, 2018, provisional application No. 62/711,334, filed on Jul. 27, 2018, provisional application No. 62/711,464, filed on Jul. 27, 2018, provisional application No. 62/711,467, filed on Jul. 27, 2018, provisional application No. 62/711,406, filed on Jul. 27, 2018, provisional application No. 62/711,468, filed on Jul. 27, 2018, provisional application No. 62/711,457, filed on Jul. 27, 2018, provisional application No. 62/711,406, filed on Jul. 27, 2018.

(51) Int. Cl.
*H01L 21/687* (2006.01)
*H02M 3/335* (2006.01)
*H03K 3/57* (2006.01)
*H05K 7/20* (2006.01)
*H03M 1/12* (2006.01)

(52) U.S. Cl.
CPC ..... *H05K 7/20254* (2013.01); *H05K 7/20272* (2013.01); *H05K 7/20281* (2013.01); *H05K 7/20509* (2013.01)

(56) References Cited

U.S. PATENT DOCUMENTS

| | | | | |
|---|---|---|---|---|
| 10,892,141 | B2* | 1/2021 | Ziemba | H01J 37/32091 |
| 10,903,047 | B2* | 1/2021 | Ziemba | H01J 37/32146 |
| 10,916,408 | B2* | 2/2021 | Dorf | H01J 37/32146 |
| 10,978,955 | B2* | 4/2021 | Ziemba | H02M 7/5387 |
| 11,222,767 | B2* | 1/2022 | Ziemba | H01J 37/3467 |
| 11,404,246 | B2* | 8/2022 | Ziemba | H01J 37/32174 |
| 11,476,145 | B2* | 10/2022 | Rogers | H01J 37/32917 |
| 2005/0184669 | A1* | 8/2005 | Chistyakov | H01J 37/3266 315/111.21 |
| 2008/0231337 | A1* | 9/2008 | Krishnaswamy | H03K 3/537 327/291 |
| 2020/0036367 | A1* | 1/2020 | Slobodov | H05K 7/20154 |

\* cited by examiner

NANOSECOND PULSER PULSE GENERATION

CROSS-REFERENCE TO RELATED APPLICATIONS

This application claims priority to U.S. Provisional Patent Application No. 62/711,464 filed Jul. 27, 2018, titled "NANOSECOND PULSER SYSTEM," which is incorporated by reference in its entirety.

This application claims priority to U.S. Provisional Patent Application No. 62/711,334 filed Jul. 27, 2018, titled "NANOSECOND PULSER THERMAL MANAGEMENT," which is incorporated by reference in its entirety.

This application claims priority to U.S. Provisional Patent Application No. 62/711,457 filed Jul. 27, 2018, titled "NANOSECOND PULSER PULSE GENERATION," which is incorporated by reference in its entirety.

This application claims priority to U.S. Provisional Patent Application No. 62/711,347 filed Jul. 27, 2018, titled "NANOSECOND PULSER ADC SYSTEM," which is incorporated by reference in its entirety.

This application claims priority to U.S. Provisional Patent Application No. 62/711,467 filed Jul. 27, 2018, titled "EDGE RING POWER SYSTEM," which is incorporated by reference in its entirety.

This application claims priority to U.S. Provisional Patent Application No. 62/711,406 filed Jul. 27, 2018, titled "NANOSECOND PULSER BIAS COMPENSATION," which is incorporated by reference in its entirety.

This application claims priority to U.S. Provisional Patent Application No. 62/711,468 filed Jul. 27, 2018, titled "NANOSECOND PULSER CONTROL MODULE," which is incorporated by reference in its entirety.

This application claims priority to U.S. Provisional Patent Application No. 62/711,523 filed Aug. 10, 2018, titled "PLASMA SHEATH CONTROL FOR RF PLASMA REACTORS," which is incorporated by reference in its entirety.

This application claims priority to U.S. Provisional Patent Application No. 62/789,523 filed Jan. 1, 2019, titled "EFFICIENT NANOSECOND PULSER WITH SOURCE AND SINK CAPABILITY FOR PLASMA CONTROL APPLICATIONS," which is incorporated by reference in its entirety.

This application claims priority to U.S. Provisional Patent Application No. 62/789,526 filed Jan. 1, 2019, titled "EFFICIENT ENERGY RECOVERY IN A NANOSECOND PULSER CIRCUIT," which is incorporated by reference in its entirety.

This application claims priority to and is a continuation-in-part of U.S. Non-Provisional patent application Ser. No. 16/523,840 filed Jul. 26, 2019, titled "NANOSECOND PULSER BIAS COMPENSATION," which is incorporated by reference in its entirety.

BACKGROUND

Producing high voltage pulses with fast rise times and/or fast fall times is challenging. For instance, to achieve a fast rise time and/or a fast fall time (e.g., less than about 50 ns) for a high voltage pulse (e.g., greater than about 5 kV), the slope of the pulse rise and/or fall must be incredibly steep (e.g., greater than $10^{11}$ V/s). Such steep rise times and/or fall times are very difficult to produce especially in circuits driving a load with low capacitance. Such pulse may be especially difficult to produce using standard electrical components in a compact manner; and/or with pulses having variable pulse widths, voltages, and repetition rates; and/or within applications having capacitive loads such as, for example, a plasma. Some plasma deposition systems may not produce similar pulses and may not produce wafers as efficiently.

SUMMARY

Some embodiments include high voltage pulsing power supply that includes a high voltage pulser having an output that provides pulses with an amplitude greater than about 1 kV, a pulse width less than about 1 μs, and a pulse repetition frequency greater than about 20 kHz; a plasma chamber; and an electrode disposed within the plasma chamber that is electrically coupled with the output of the high voltage pulser to produce an electric field within the plasma chamber.

In some embodiments, an inductance between the output of the high voltage pulser and at the electrode may be less than about 10 μH. In some embodiments, the capacitance between the output of the high voltage pulser and ground may be less than about 10 nF.

In some embodiments, the high voltage pulsing power supply may also include a control module that measures the voltage of the output pulses.

In some embodiments, the high voltage pulsing power supply may also include a bias capacitor disposed between the high voltage pulser and the electrode; and bias compensation power supply electrically coupled with the high voltage pulser and the electrode, the bias compensation power supply produces a voltage across the bias capacitor.

In some embodiments, the high voltage pulsing power supply may also include a resistive output stage electrically coupled with the high voltage pulser and the electrode that removes charge from a load at fast time scales.

In some embodiments, the resistive output stage includes an inductor and a capacitor arranged in series, wherein the inductor has an inductance less than about 200 μH.

In some embodiments, the high voltage pulsing power supply may also include an energy recovery circuit electrically coupled with the high voltage pulser and the electrode that removes charge from a load at fast time scales.

In some embodiments, the high voltage pulsing power supply may also include a control module electrically coupled with the high voltage pulser that produces a low voltage signal that controls the pulse width and the pulse repetition frequency of the output pulses.

In some embodiments, the high voltage pulsing power supply may also include a second high voltage pulser having an output that provides pulses with an amplitude greater than about 1 kV, a pulse width less than about 1 μs, and a pulse repetition frequency greater than about 20 kHz; and a second electrode disposed within the plasma chamber that is electrically coupled with the output of the second high voltage pulser to produce a pulsing an electric field within the plasma chamber near the second electrode.

In some embodiments, the pulses from the high voltage pulser and the pulses from the second high voltage pulser differ in at least one of voltage, pulse width, and pulse repetition frequency.

In some embodiments, the high voltage pulsing power supply may also include a thermal management subsystem comprising one or more switch cold plates and one or more transformer core cold plates, wherein the high voltage pulser comprises a plurality of switches coupled with the one or more switch cold plates and a transformer coupled with the one or more transformer core cold plates.

In some embodiments, the thermal management subsystem comprises a fluid that flows through the switch cold plates and the core cold plates.

In some embodiments, the high voltage pulsing power supply may also include an enclosure having a volumetric dimension of less than 1 m³, wherein the high voltage pulser is disposed within the enclosure; and at least three of the following a thermal management system, a control system, a bias capacitor, a bias compensation power supply, a second nanosecond pulser, a resistive output stage, and an energy recovery circuit are disposed within the enclosure. In some embodiments, peak electric field between any two components inside the enclosure is less than about 20 MV/m.

Some embodiments include a high voltage pulsing power supply that includes a high voltage pulser having an output that provides pulses with an amplitude greater than about 1 kV, a pulse width less than about 1 µs, and a pulse repetition frequency greater than about 20 kHz; a plasma chamber; and an electrode disposed within the plasma chamber that is electrically coupled with the output of the high voltage pulser to produce an electric field within the plasma chamber. In some embodiments, the high voltage pulsing power supply may also include a control module electrically coupled with the high voltage pulser, the control module measures the voltage of the pulses at the electrode and the control module modifies at least one of the voltage, pulse width, and pulse repetition frequency of the pulses in response to the measured voltage. In some embodiments, the high voltage pulsing power supply may also include a thermal management subsystem comprising a plurality of cold plates coupled with the high voltage pulser.

In some embodiments, the high voltage pulser comprises a plurality of switches; and a transformer coupled with the plurality of switches and the output, and having a transformer core. In some embodiments, the plurality of cold plates comprise: one or more switch cold plates coupled with the plurality of switches; and one or more transformer core cold plates coupled with the transformer core.

In some embodiments, the thermal management subsystem comprises a fluid that flows through at least one of the plurality of cold plates.

In some embodiments, the control module measures one or more parameters of the thermal management subsystem and stops the high voltage pulser from outputting pulses in the event one of the one or more parameters is out of tolerance.

Some embodiments include a high voltage pulsing power supply comprising a first high voltage pulser having a first output that provides pulses with a first amplitude greater than about 1 kV, a first pulse width less than about 1 µs, and a first pulse repetition frequency greater than about 20 kHz; a second high voltage pulser having a second output that provides pulses with a second amplitude greater than about 1 kV, a second pulse width less than about 1 µs, and a second pulse repetition frequency greater than about 20 kHz and a plasma chamber. In some embodiments, a first electrode may be disposed within the plasma chamber that is electrically coupled with the first output of the first high voltage pulser; and a second electrode may be disposed within the plasma chamber that is electrically coupled with the second output of the second high voltage pulser. In some embodiments, the high voltage pulsing power supply may also include a first bias capacitor disposed between the first high voltage pulser and the first electrode; and a second bias capacitor disposed between the second high voltage pulser and the second electrode.

In some embodiments, the high voltage pulsing power supply may also include a first bias compensation power supply electrically coupled with the first high voltage pulser and the first electrode, the first bias compensation power supply produces a voltage across the first bias capacitor; and a second bias compensation power supply electrically coupled with the second high voltage pulser and the second electrode, the second bias compensation power supply produces a voltage across the second bias capacitor.

In some embodiments, the high voltage pulsing power supply may also include a thermal management subsystem comprising a plurality of cold plates coupled with the first high voltage pulser and the second high voltage pulser.

In some embodiments, either or both the first bias capacitor or the second bias capacitor have a capacitance of more than about 1 nF.

Some embodiments of the invention include a nanosecond pulse generation system comprising: a first nanosecond pulser; a second nanosecond pulser; an interconnect board coupled with the first nanosecond pulser and the second nanosecond pulser; a resistive output stage coupled with the interconnect board and ground, the resistive output stage comprising at least a resistor and/or an inductor; and a chamber interface board coupled with the interconnect board via a capacitor.

In some embodiments, the nanosecond pulse generation system outputs pulses with amplitudes of at least 8 kV.

In some embodiments, the nanosecond pulse generation system outputs pulses with frequencies of 10 kHz or more.

In some embodiments, the nanosecond pulse generation system outputs pulses with 30 kW or power.

In some embodiments, the resistive output stage includes a resistor with a resistance of 140 ohms.

In some embodiments, the resistive output stage includes a plurality of resistor with a combined resistance of 140 ohms.

In some embodiments, the resistive output stage includes an inductor having an inductance of 15 µH.

In some embodiments, the resistive output stage includes a plurality of inductors having a combined inductance of 15 µH.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
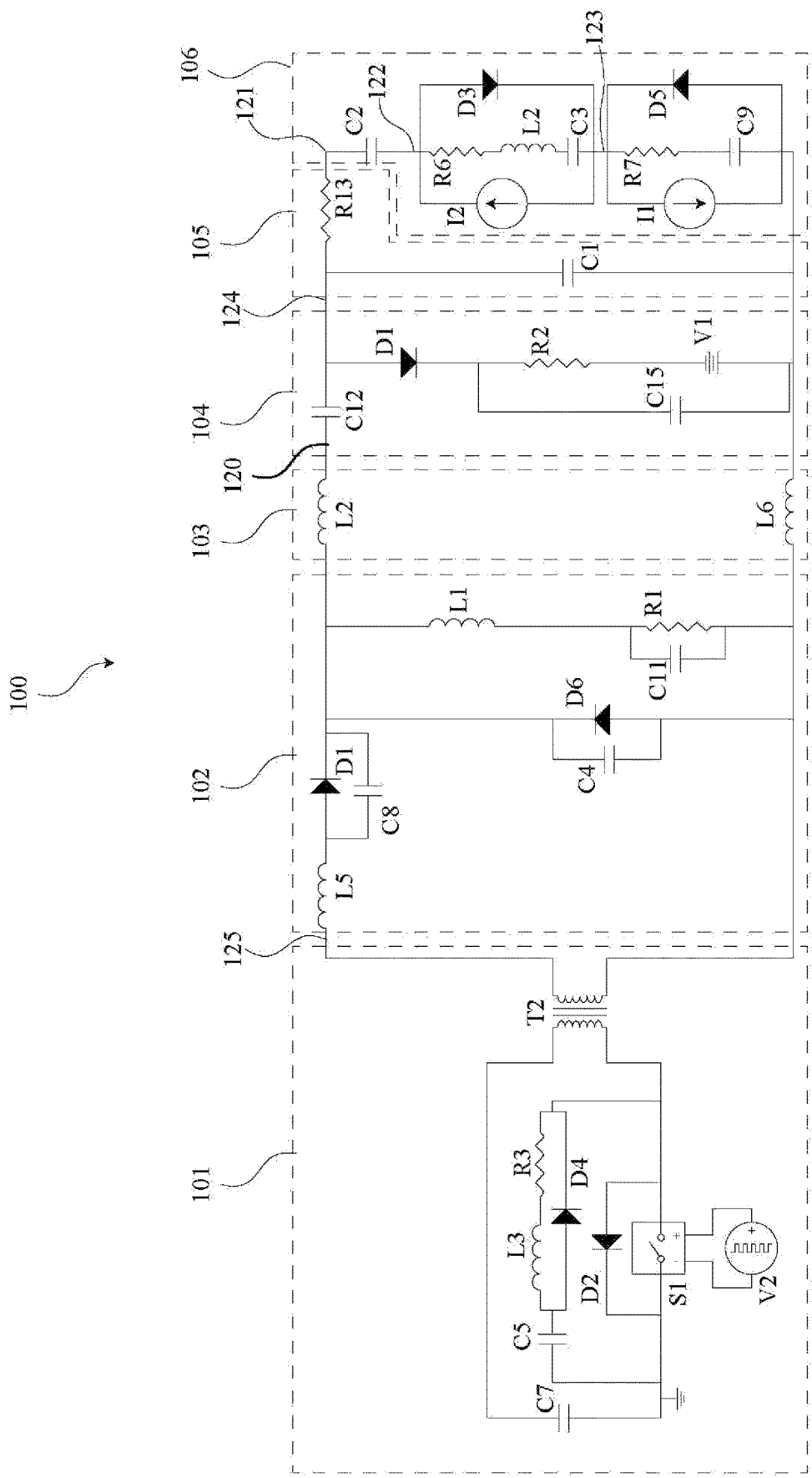
FIG. 1 is a circuit diagram of a nanosecond pulser according to some embodiments.

A nanosecond pulse generation system is disclosed. In some embodiments, the nanosecond pulse generation system may provide bursts of pulses with amplitudes of 2 kV or more into a plasma chamber. In some embodiments, the nanosecond pulse generation system may provide waveforms with pulse repetition frequencies greater than 10 kHz. In some embodiments, the nanosecond pulse generation system may include one or more nanosecond pulsers coupled with an NSP interconnect board and/or resistive output stages.

In some embodiments, a high voltage nanosecond pulser system may pulse voltages with amplitudes of more than about 2 kV to about 40 kV. In some embodiments, a high voltage nanosecond pulser system may switch with pulse repetition frequencies up to about 500 kHz or more. In some embodiments, a high voltage nanosecond pulser system may provide single pulses of varying pulse widths from about 50 nanoseconds to about 1 microsecond. In some embodiments, a high voltage nanosecond pulser system may switch at frequencies greater than about 10 kHz. In some embodiments, a high voltage nanosecond pulser system may operate with rise times less than about 20 ns up to about 200 ns.

In some embodiments, a high voltage nanosecond pulser system may include a number of components or subsystems. These may include one or more of a resistive output stage (e.g., resistive output stage 102), an energy recovery circuit (e.g., energy recovery circuit 165), a spatially variable wafer bias system (e.g., spatially variable wafer bias power system 400), a bias compensation circuit (e.g., bias compensation circuit 104, 514 or 614), a control module (e.g., controller 825), a first ADC (e.g., first ADC 820), a Multilam second ADC (e.g., second ADC 845), a plurality of sensors, a thermal management system (e.g., thermal management system 1000), etc.

FIG. 1 is a circuit diagram of a nanosecond pulser system 100 according to some embodiments. The nanosecond pulser system 100 can be implemented within a high voltage nanosecond pulser system. The nanosecond pulser system 100 can be generalized into five stages (these stages could be broken down into other stages or generalized into fewer stages and/or may or may not include the components shown in the figure). The nanosecond pulser system 100 includes a pulser and transformer stage 101, a resistive output stage 102, a lead stage 103, a DC bias compensation circuit 104, and a load stage 106.

In some embodiments, the nanosecond pulser system 100 can produce pulses from the power supply with voltages greater than 2 kV, with rise times less than about 20 ns, and frequencies greater than about 10 kHz.

In some embodiments, the pulser and transformer stage 101 can produce a plurality of high voltage pulses with a high frequency and fast rise times and fall times. In all of the circuits shown, the high voltage pulser may comprise a nanosecond pulser.

In some embodiments, the pulser and transformer stage 101 can include one or more solid state switches S1 (e.g., solid state switches such as, for example, IGBTs, a MOSFETs, a SiC MOSFETs, SiC junction transistors, FETs, SiC switches, GaN switches, photoconductive switches, etc.), one or more snubber resistors R3, one or more snubber diodes D4, one or more snubber capacitors C5, and/or one or more freewheeling diodes D2. One or more switches and or circuits can be arranged in parallel or series.

In some embodiments, the load stage 106 may represent an effective circuit for a plasma deposition system, plasma etch system, or plasma sputtering system. The capacitance C2 may represent the capacitance of the dielectric material upon which a wafer may sit or capacitance C2 may represent the capacitance between an electrode and a wafer which are separated by a dielectric material. The capacitor C3 may represent the sheath capacitance of the plasma to the wafer. The capacitor C9 may represent capacitance within the plasma between a chamber wall and the top surface of the wafer. The current source I2 and the current source I1 may represent the ion current through the plasma sheaths.

In some embodiments, the resistive output stage 102 may include one or more inductive elements represented by inductor L1 and/or inductor L5. The inductor L5, for example, may represent the stray inductance of the leads in the resistive output stage 102. Inductor L1 may be set to minimize the power that flows directly from the pulser and transformer stage 101 into resistor R1.

In some embodiments, the resistor R1 may dissipate charge from the load stage 106, for example, on fast time scales (e.g., 1 ns, 10 ns, 50 ns, 100 ns, 250 ns, 500 ns, 1,000 ns, etc. time scales). The resistance of resistor R1 may be low to ensure the pulse across the load stage 106 has a fast fall time $t_f$.

In some embodiments, the resistor R1 may include a plurality of resistors arranged in series and/or parallel. The capacitor C11 may represent the stray capacitance of the resistor R1 including the capacitance of the arrangement series and/or parallel resistors. The capacitance of stray capacitance C11, for example, may be less than 5 nF, 2 nF, 1 nF, 500 pF, 250 pF, 100 pF, 50 pF, 10 pF, 1 pF, etc. The capacitance of stray capacitance C11, for example, may be less than the load capacitance such as, for example, less than the capacitance of C2, C3, and/or C9.

In some embodiments, a plurality of pulser and transformer stages 101 can be arranged in parallel and coupled with the resistive output stage 102 across the inductor L1 and/or the resistor R1. Each of the plurality of pulser and transformer stages 101 may each also include diode D1 and/or diode D6.

In some embodiments, the capacitor C8 may represent the stray capacitance of the blocking diode D1. In some embodiments, the capacitor C4 may represent the stray capacitance of the diode D6.

In some embodiments, the DC bias compensation circuit 104 may include a DC voltage source V1 that can be used to bias the output voltage either positively or negatively. In some embodiments, the capacitor C12 isolates/separates the DC bias voltage from the resistive output stage and other circuit elements. It allows for a potential shift from one portion of the circuit to another. In some applications the potential shift it establishes is used to hold a wafer in place. Resistance R2 may protect/isolate the DC bias supply from the high voltage pulsed output from the pulser and transformer stage 101.

In this example, the DC bias compensation circuit 104 is a passive bias compensation circuit and can include a bias compensation diode D1 and a bias compensation capacitor C15. The bias compensation diode C15 can be arranged in series with offset supply voltage V1. The bias compensation capacitor C15 can be arranged across either or both the offset supply voltage V1 and the resistor R2. The bias compensation capacitor C15 can have a capacitance less than 100 nH to 100 µF such as, for example, about 100 µF, 50 µF, 25 µF, 10 µF, 2µ, 500 nH, 200 nH, etc.

In some embodiments, the bias capacitor C12 may allow for a voltage offset between the output of the pulser and transformer stage 101 (e.g., at the position labeled 125) and the voltage on the electrode (e.g., at the position labeled 124). In operation, the electrode may, for example, be at a DC voltage of –2 kV during a burst, while the output of the nanosecond pulser alternates between +6 kV during pulses and 0 kV between pulses.

The bias capacitor C12, for example, 100 nF, 10 nF, 1 nF, 100 pF, 10 µF, 1 µF, etc. The resistor R2, for example, may have a high resistance such as, for example, a resistance of about 1 kOhm, 10 kOhm, 100 kOhm, 1 MOhm, 10 MOhm, 100 MOhm, etc.

In some embodiments, the bias compensation capacitor C15 and the bias compensation diode D1 may allow for the voltage offset between the output of the pulser and transformer stage 101 (e.g., at the position labeled 125) and the voltage on the electrode (e.g., at the position labeled 124) to be established at the beginning of each burst, reaching the needed equilibrium state. For example, charge is transferred from bias capacitor C12 into bias compensation capacitor C15 at the beginning of each burst, over the course of a plurality of pulses (e.g., about 5-100 pulses), establishing the correct voltages in the circuit.

In some embodiments, the DC bias compensation circuit 104 may include one or more high voltage switches placed across the bias compensation diode D1 and coupled with the power supply V1. In some embodiments, a high voltage switch may include a plurality of switches arranged in series to collectively open and close high voltages.

A high voltage switch may be coupled in series with either or both an inductor and a resistor. The inductor may limit peak current through high voltage switch. The inductor, for example, may have an inductance less than about 100 pH such as, for example, about 250 µH, 100 µH, 50 µH, 25 µH, 10 µH, 5 µH, 1 µH, etc. The resistor, for example, may shift power dissipation to the resistive output stage 102. The resistance of resistor may have a resistance of less than about 1,000 ohms, 500 ohms, 250 ohms, 100 ohms, 50 ohms, 10 ohms, etc.

In some embodiments, a high voltage switch may include a snubber circuit.

In some embodiments, the high voltage switch may include a plurality of switches arranged in series to collectively open and close high voltages. For example, the high voltage switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, a high voltage switch may be open while the pulser and transformer stage 101 is pulsing and closed when the pulser and transformer stage 101 is not pulsing. When the high voltage switch is closed, for example, current can short across the bias compensation diode C15. Shorting this current may allow the bias between the wafer and the chuck to be less than 2 kV, which may be within acceptable tolerances.

In some embodiments, the pulser and transformer stage 101 can produce pulses having a high pulse voltage (e.g., voltages greater than 1 kV, 10 kV, 20 kV, 50 kV, 100 kV, etc.), high pulse repetition frequencies (e.g., frequencies greater than 1 kHz, 10 kHz, 100 kHz, 200 kHz, 500 kHz, 1 MHz, etc.), fast rise times (e.g., rise times less than about 1 ns, 10 ns, 50 ns, 100 ns, 250 ns, 500 ns, 1,000 ns, etc.), fast fall times (e.g., fall times less than about 1 ns, 10 ns, 50 ns, 100 ns, 250 ns, 500 ns, 1,000 ns, etc.) and/or short pulse widths (e.g., pulse widths less than about 1,000 ns, 500 ns, 250 ns, 100 ns, 20 ns, etc.).

Figure 2:
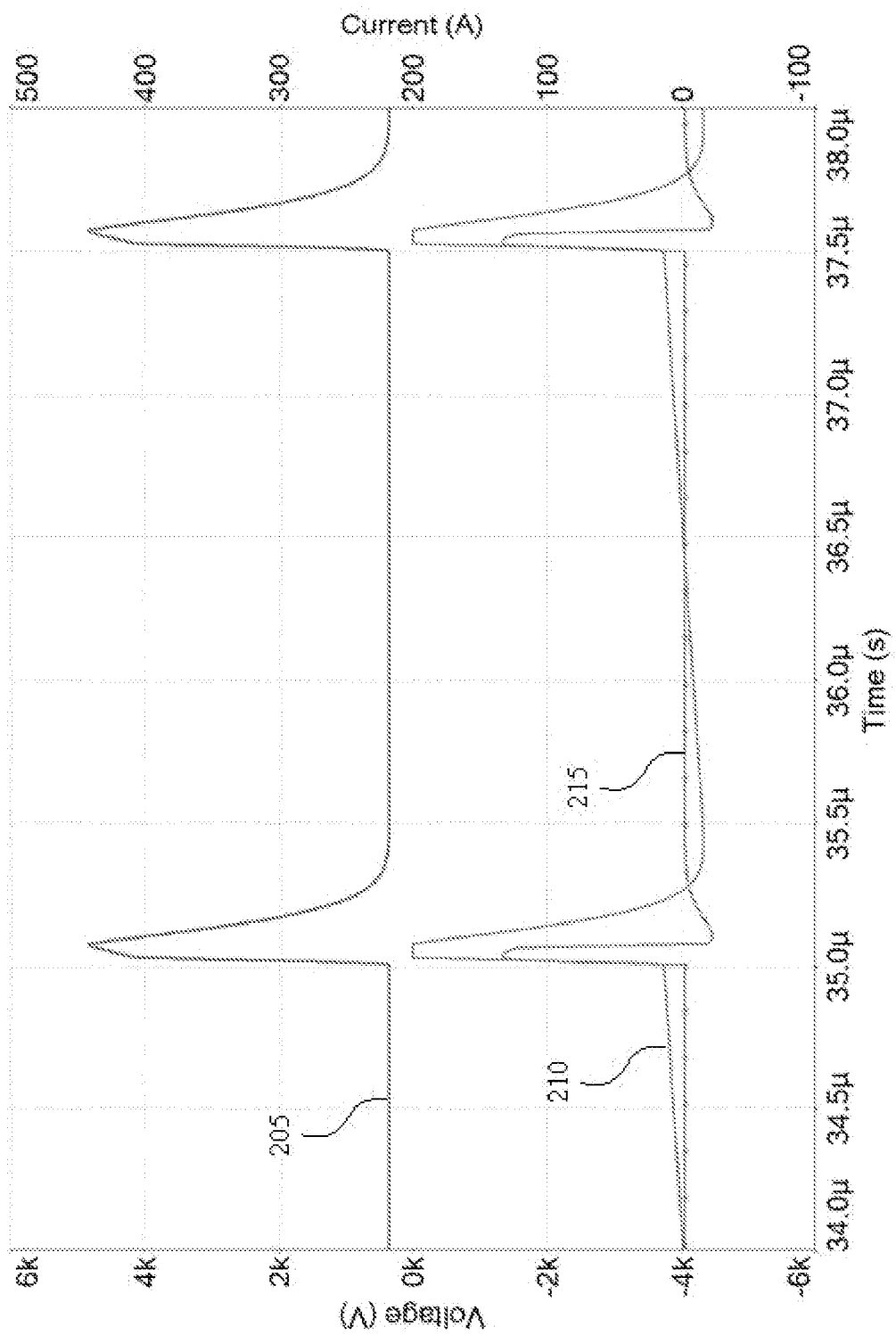
FIG. 2 shows example waveforms produced by the nanosecond pulser.

FIG. 2 shows example waveforms produced by the nanosecond pulser system 100. In these example waveforms, the pulse waveform 205 may represent the voltage provided by the pulser and transformer stage 101. As shown, the pulse waveform 205 produces a pulse with the following qualities: high voltage (e.g., greater than about 4 kV as shown in the waveform), a fast rise time (e.g., less than about 200 ns as shown in the waveform), a fast fall time (e.g., less than about 200 ns as shown in the waveform), and short pulse width (e.g., less than about 300 ns as shown in the waveform). The waveform 210 may represent the voltage at the surface of a wafer represented in nanosecond pulser system 100 by the point between capacitor C2 and capacitor C3 or the voltage across capacitor C3. The pulse waveform 215 represent the current flowing from the pulser and transformer stage 101 to the plasma. The nanosecond pulser system 100 may or may not include either or both diodes D1 or D2.

During the transient state (e.g., during an initial number of pulses not shown in the figure), the high voltage pulses from the pulser and transformer stage 101 charge the capacitor C2. Because the capacitance of capacitor C2 is large compared to the capacitance of capacitor C3 and/or capacitor C1, and and/or because of the short pulse widths of the pulses, the capacitor C2 may take a number of pulses from the high voltage pulser to fully charge. Once the capacitor C2 is charged the circuit reaches a steady state, as shown by the waveforms in FIG. 2.

In steady state and when the switch S1 is open, the capacitor C2 is charged and slowly dissipates through the resistive output stage 110, as shown by the slightly rising slope of waveform 210. Once the capacitor C2 is charged and while the switch S1 is open, the voltage at the surface of the waver (the point between capacitor C2 and capacitor C3) is negative. This negative voltage may be the negative value of the voltage of the pulses provided by the pulser and transformer stage 101. For the example waveform shown in FIG. 2, the voltage of each pulse is about 4 kV; and the steady state voltage at the wafer is about –4 kV. This results in a negative potential across the plasma (e.g., across capacitor C3) that accelerates positive ions from the plasma to the surface of the wafer. While the switch S1 is open, the charge on capacitor C2 slowly dissipates through the resistive output stage.

When the switch S1 is closed, the voltage across the capacitor C2 may flip (the pulse from the pulser is high as shown in waveform 205) as the capacitor C2 is charged. In addition, the voltage at the point between capacitor C2 and capacitor C3 (e.g., at the surface of the wafer) changes to about zero as the capacitor C2 charges, as shown in waveform 210. Thus, the pulses from the high voltage pulser produce a plasma potential (e.g., a potential in a plasma) that rise from a negative high voltage to zero and returns to the negative high voltage at high frequencies, with fast rise times, fast fall times, and/or short pulse widths.

In some embodiments, the action of the resistive output stage, elements represented by the resistive output stage 102, that may rapidly discharge the stray capacitance C1, and may allow the voltage at the point between capacitor C2 and capacitor C3 to rapidly return to its steady negative value of about −4 kV as shown by waveform 210. The resistive output stage may allow the voltage at the point between capacitor C2 and capacitor C3 to exists for about % of the time, and thus maximizes the time which ions are accelerated into the wafer. In some embodiments, the components contained within the resistive output stage may be specifically selected to optimize the time during which the ions are accelerated into the wafer, and to hold the voltage during this time approximately constant. Thus, for example, a short pulse with fast rise time and a fast fall time may be useful, so there can be a long period of fairly uniform negative potential.

Various other waveforms may be produced by the nanosecond pulser system 100.

Figure 3:
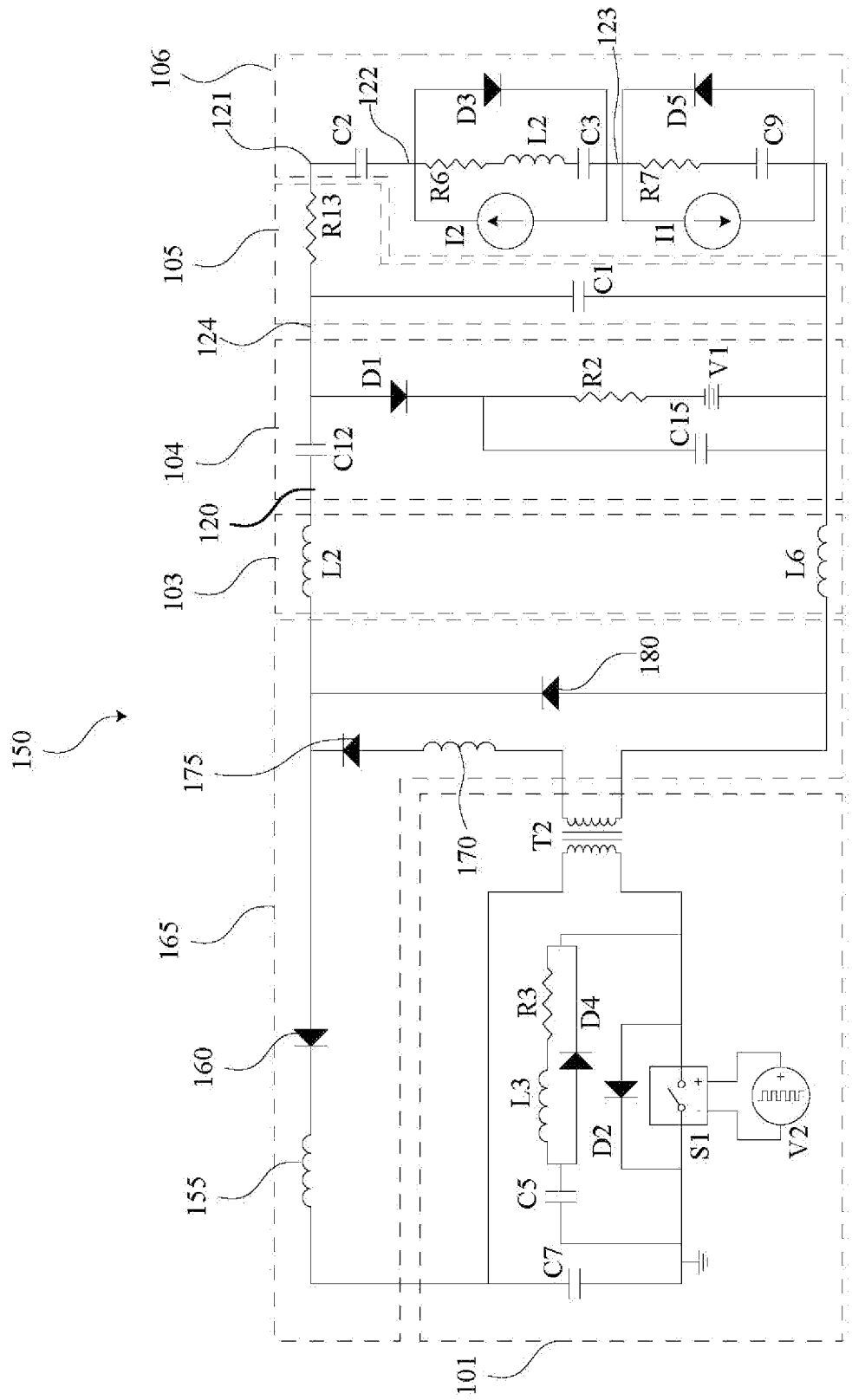
FIG. 3 is another a circuit diagram of a nanosecond pulser according to some embodiments.

FIG. 3 is a circuit diagram of a nanosecond pulser system 150 with the pulser and transformer stage 101 and an energy recovery circuit 165 according to some embodiments. The energy recovery circuit, for example, may replace the resistive output stage 102 shown in FIG. 1. In this example, the energy recovery circuit 165 may be positioned on or electrically coupled with the secondary side of the transformer T1. The energy recovery circuit 165, for example, may include a diode 180 (e.g., a crowbar diode) across the secondary side of the transformer T1. The energy recovery circuit 165, for example, may include diode 160 and inductor 155 (arranged in series), which can allow current to flow from the secondary side of the transformer T1 to charge the power supply C7. The diode 160 and the inductor 155 may be electrically connected with the secondary side of the transformer T1 and the power supply C7. In some embodiments, the energy recovery circuit 165 may include diode 175 and/or inductor 170 electrically coupled with the secondary of the transformer T1. The inductor 170 may represent the stray inductance and/or may include the stray inductance of the transformer T1.

When the nanosecond pulser is turned on, current may charge the load stage 106 (e.g., charge the capacitor C3, capacitor C2, or capacitor C9). Some current, for example, may flow through inductor 155 when the voltage on the secondary side of the transformer T1 rises above the charge voltage on the power supply C7. When the nanosecond pulser is turned off, current may flow from the capacitors within the load stage 106 through the inductor 155 to charge the power supply C7 until the voltage across the inductor 155 is zero. The diode 180 may prevent the capacitors within the load stage 106 from ringing with the inductance in the load stage 106 or the bias compensation circuit 104.

The diode 160 may, for example, prevent charge from flowing from the power supply C7 to the capacitors within the load stage 106.

The value of inductor 155 can be selected to control the current fall time. In some embodiments, the inductor 155 can have an inductance value between 1 μH-500 μH.

In some embodiments, the energy recovery circuit 165 may include an energy recovery switch that can be used to control the flow of current through the inductor 155. The energy recovery switch, for example, may be placed in series with the inductor 155. In some embodiments, the energy recovery switch may be closed when the switch S1 is open and/or no longer pulsing to allow current to flow from the load stage 106 back to the high voltage load C7.

In some embodiments, the energy recovery switch may include a plurality of switches arranged in series to collectively open and close high voltages. For example, the energy recovery switch may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the stray capacitance between the pulser and transformer stage 101 and ground is less than about 10 nF.

In some embodiments, the nanosecond pulser system 150 may produce similar waveforms as those shown in FIG. 2.

Figure 4:
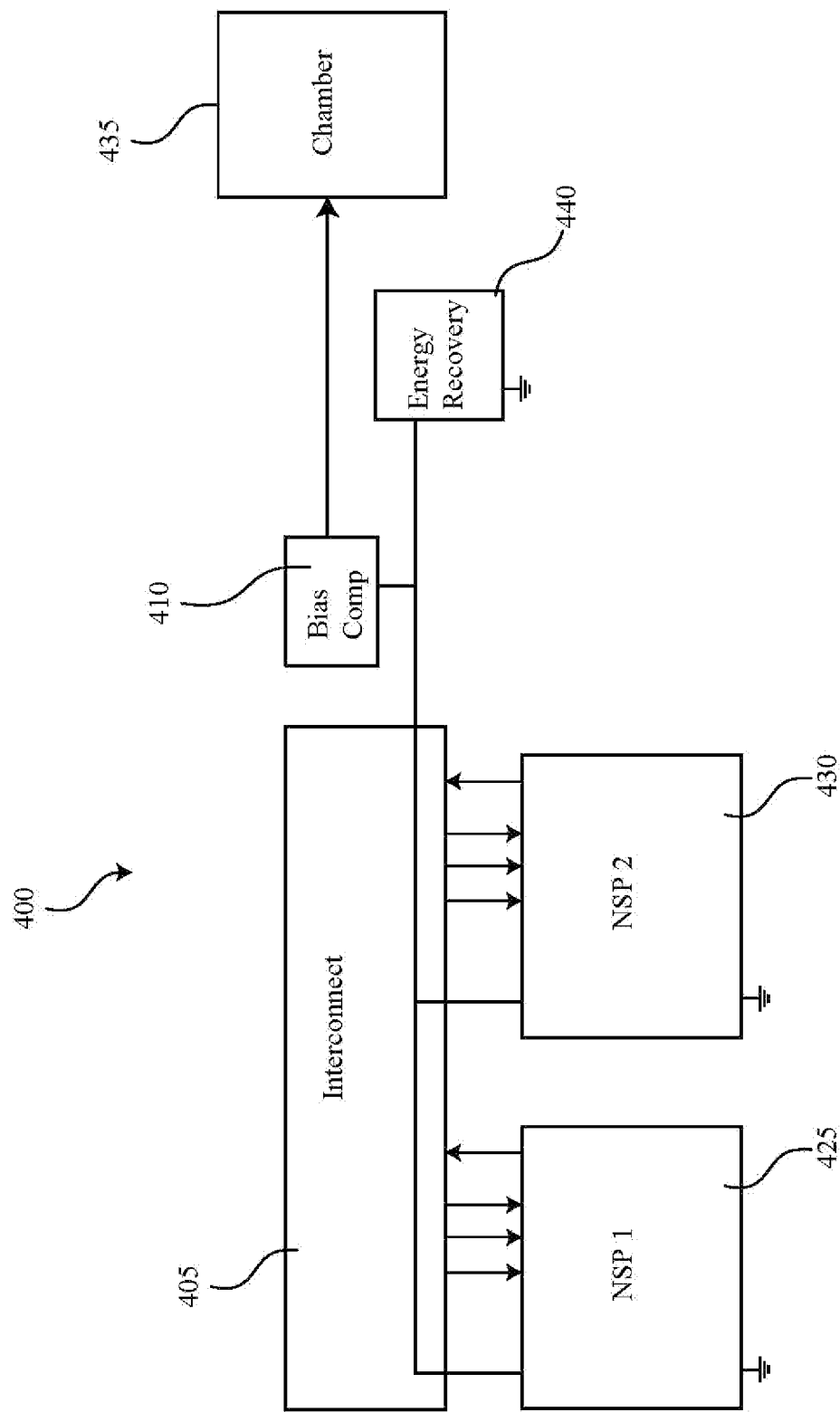
FIG. 4 is a block diagram of a spatially variable wafer bias power system according to some embodiments.

FIG. 4 is a block diagram of a spatially variable wafer bias power system 400 according to some embodiments. The spatially variable wafer bias power system 400 may include the first high voltage pulser 425 and the second high voltage pulser 430.

An interconnect board 405 may be electrically coupled with the first high voltage pulser 425 and the second high voltage pulser 430 or additional high voltage pulsers. In some embodiments, the interconnect board 405 may provide a high DC voltage to each of the first high voltage pulser 425 or the second high voltage pulser 430. In some embodiments, the interconnect board 405 may provide trigger signals to the first high voltage pulser 425 or the second high voltage pulser 430. In some embodiments, the interconnect board 405 may provide low voltage pulses to the first high voltage pulser 425 or the second high voltage pulser 430.

In some embodiments, the interconnect board 405 may include a controller or processor that includes one or more components of computational system 1500. In some embodiments, one more sensors may be included that measure a characteristic of the plasma chamber such as, for example, the electric field on the surface of a wafer, the uniformity of an electric field, the voltage on a first electrode, the voltage on a second electrode, the voltage across a resistor in one or more resistive output stages or one or more energy recovery circuits. Based on the measurement from the sensors, the voltage, pulse width, or pulse repetition frequency of the first high voltage pulser 425 and the second high voltage pulser 430 may be adjusted.

For example, if the voltage on the second electrode is measured and determined to be lower than the voltage on the first electrode, which may cause an electric filed nonuniformity (e.g., differences less than about 5%, 10%, 15%, or 20%) on the surface of the wafer. The controller may adjust the pulse width of the control pulse being sent to the second high voltage pulser 430, which may increase the voltage produced by the second high voltage pulser 430 (e.g., by increasing the capacitive charging time) and, therefore, increasing the electric field on the second electrode. The process may repeat until the electric field across the surface of the wafer is uniform (e.g., within 10%, 15%, 20%, 25%, etc.).

As another example, the voltages across a first resistive output stage and a second resistive output stages may be measured. These voltage can correspond to the current flowing from the chamber to ground as the capacitance in the chamber discharges. This current may be proportional to the ion energy. If the ion energy is at the first electrode and the ion energy at the second electrode are nonuniform or misaligned (e.g., a difference greater than 10%, 20% or 30%), then the controller may adjust the pulse width of the control pulse being sent to either the first high voltage pulser 425 or the second high voltage pulser 430, which may increase the voltage produced by the nanosecond pulser (e.g., by increasing the capacitive charging time) and, therefore, increasing the electric field on the corresponding electrode.

In some embodiments, pulses from the first high voltage pulser 425 and the second high voltage pulser 430 may pass to the energy recovery circuit 440 and to the plasma chamber 435 via a chamber interface board. The energy recovery circuit 440, for example, may include the resistive output stage 102 of nanosecond pulser system 100. As another example, the energy recovery circuit 440 may include the energy recovery circuit 165. As another example, the energy recovery circuit 440 may not be used. As another example, an energy recovery circuit 440 may be coupled with either or both the first high voltage pulser 425 or the second high voltage pulser 430. In some embodiments, the plasma chamber 435 may include a plasma chamber, an etch chamber, a deposition chamber, etc. In some embodiments, the effective circuit of the plasma chamber 435 may include load stage 106.

In some embodiments, the bias compensation circuit 410 may include any or all components shown in bias compensation circuit 104, 514, or 614. In some embodiments, a plurality of bias compensation circuits may be used. For example, a first bias compensation circuit may be coupled with the first high voltage pulser 425 and the first electrode; and a second bias compensation circuit may be coupled with the second high voltage pulser 430 and the second electrode. The bias compensation circuit, for example, may include a bias compensation capacitor C12, that may have a capacitance of 100 pF, 10 pF, 1 pF, 100 µF, 10 µF, 1 µF, etc.

While two high voltage pulsers are shown, any number may be used. For example, multiple rings of electrodes may be coupled with multiple high voltage pulsers.

In some embodiments, the first high voltage pulser 425 may produce pulses that are different than pulses produced by the second high voltage pulser 430. For example, the first high voltage pulser 425 may provide pulses of at least 2 kV of pulsed output. In some embodiments, the second high voltage pulser 430 may provide pulses of at least 2 kV of pulsed output that are either the same or different than the pulses provided by the first high voltage pulser 425.

As another example, the first high voltage pulser 425 may produce pulses with a first pulse repetition frequency and the second high voltage pulser 430 may produce pulses with a second pulse repetition frequency. The first pulse repetition frequency and the second pulse repetition frequency may be the same or different. The first pulse repetition frequency and the second pulse repetition frequency may be in phase or out of phase with respect to each other.

As another example, the first high voltage pulser 425 may produce a first plurality of bursts with a first burst repetition frequency and the second high voltage pulser 430 may produce a second plurality of bursts with a second burst repetition frequency. Each burst may comprise a plurality of pulses. The first burst repetition frequency and the second burst repetition frequency may be the same or different. The first burst repetition frequency and the second burst repetition frequency may be in phase or out of phase with respect to each other.

In some embodiments, the first high voltage pulser 425 and the second high voltage pulser 430 may be water- or dielectric-cooled.

In some embodiments, the cable or transmission line between the output of the first high voltage pulser 425 and the output of the second high voltage pulser 430 and the plasma chamber 435 (or the electrodes) may be greater than 5 m, 10 m, 15 m, etc.

In some embodiments, the inductance between any of the following components may be less than about 100 µH: the first high voltage pulser 425, the second high voltage pulser 430, and the plasma chamber 435.

In some embodiments, the stray capacitance between the first high voltage pulser 425 or the second high voltage pulser 430 and ground is less than about 10 nF.

Figure 5:
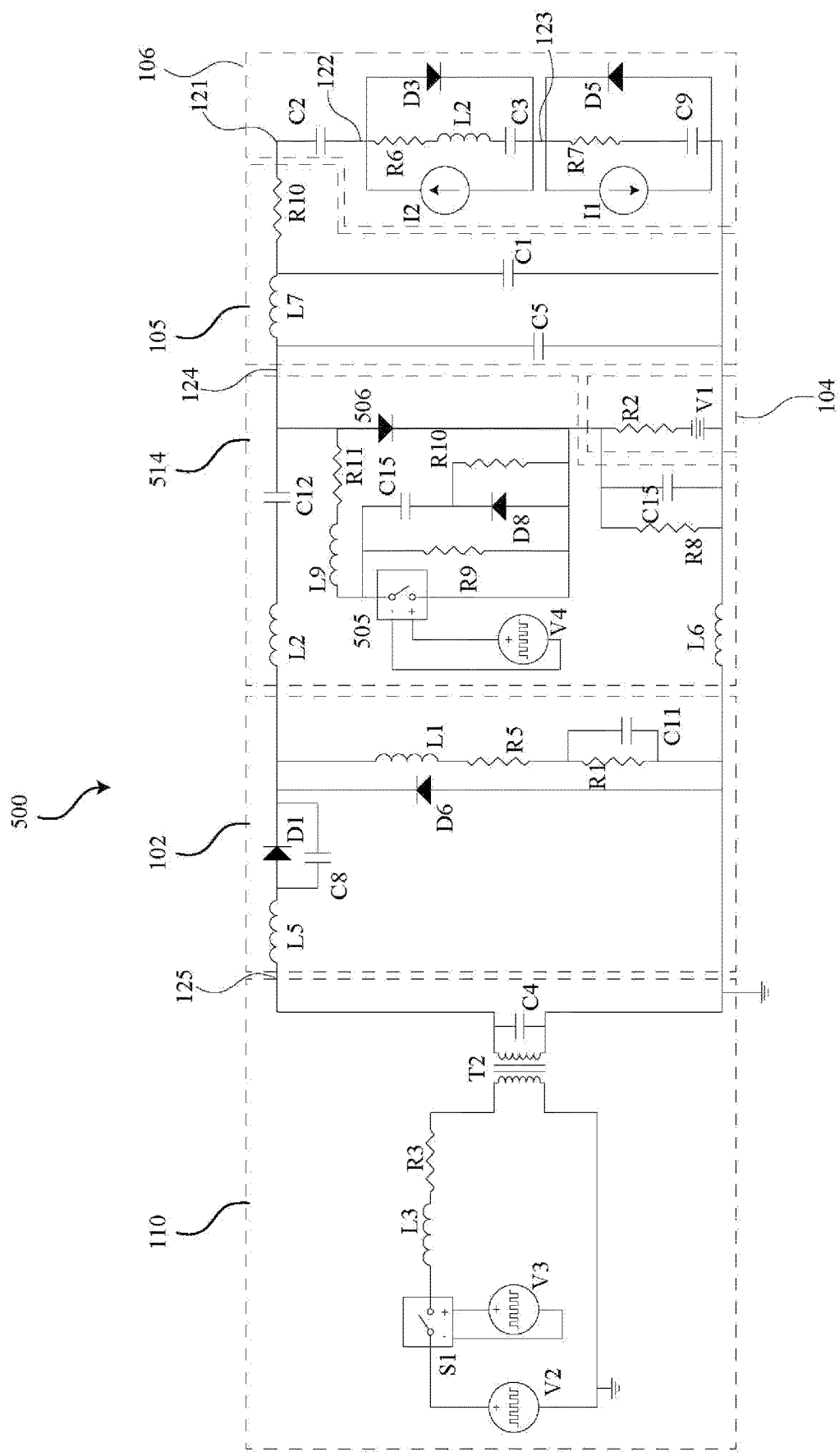
FIG. 5 is a circuit diagram of a high voltage power system with a plasma load according to some embodiments.

FIG. 5 is a circuit diagram of a high voltage power system with a plasma load 500 according to some embodiments. The high voltage power system with a plasma load 500 is similar to high voltage power system with a plasma load 500.

In this embodiment, the bias compensation circuit 514, can include a high voltage switch 505 coupled across the bias compensation diode 506 and coupled with power supply V1. In some embodiments, the high voltage switch 505 may include a plurality of switches 505 arranged in series to collectively open and close high voltages. For example, the high voltage switch 505 may include the high voltage switch 700 described in FIG. 7. In some embodiments, the high voltage switch 505 may be coupled with a switch trigger V4.

The high voltage switch 505 may be coupled in series with either or both an inductor L9 and a resistor R11. The inductor L9 may limit peak current through high voltage switch 505. The inductor L9, for example, may have an inductance less than about 100 µH such as, for example, about 250 µH, 100 µH, 50 µH, 25 µH, 10 µH, 5 µH, 1 µH, etc. The resistor R11, for example, may shift power dissipation to the resistive output stage 102. The resistance of resistor R11, for example, may have a resistance of less than about 1,000 ohms, 500 ohms, 250 ohms, 100 ohms, 50 ohms, 10 ohms, etc.

In some embodiments, the high voltage switch 505 may include a snubber circuit. The snubber circuit may include resistor R9, snubber diode D8, snubber capacitor C15, and snubber resistor R10.

In some embodiments, the resistor R8 can represent the stray resistance of the offset supply voltage V1. The resistor R8, for example, may have a high resistance such as, for example, a resistance of about 10 kOhm, 100 kOhm, 1 MOhm, 10 MOhm, 100 MOhm, 1 GOhm, etc.

In some embodiments, the high voltage switch 505 may include a plurality of switches arranged in series to collectively open and close high voltages. For example, the high voltage switch 505 may include the high voltage switch 700 described in FIG. 7. As another example, the high voltage switch 505 may, for example, include any switch described in U.S. patent application Ser. No. 16/178,565, filed Nov. 1, 2018, titled "High Voltage Switch with Isolated Power," which is incorporated into this disclosure in its entirety for all purposes.

In some embodiments, the high voltage switch 505 may be open while the pulser and transformer stage 101 is pulsing and closed when the pulser and transformer stage 101 is not pulsing. When the high voltage switch 505 is closed, for example, current can short across the bias compensation diode 506. Shorting this current may allow the bias between the wafer and the chuck to be less than 2 kV, which may be within acceptable tolerances.

In some embodiments, the high voltage switch 505 can allow the electrode voltage (the position labeled 124) and the wafer voltage (the position labeled 122) to be quickly restored (e.g., less than about 100 ns, 200 ns, 500 ns, 1 μs) to the chucking potential (the position labeled 121).

Figure 6:
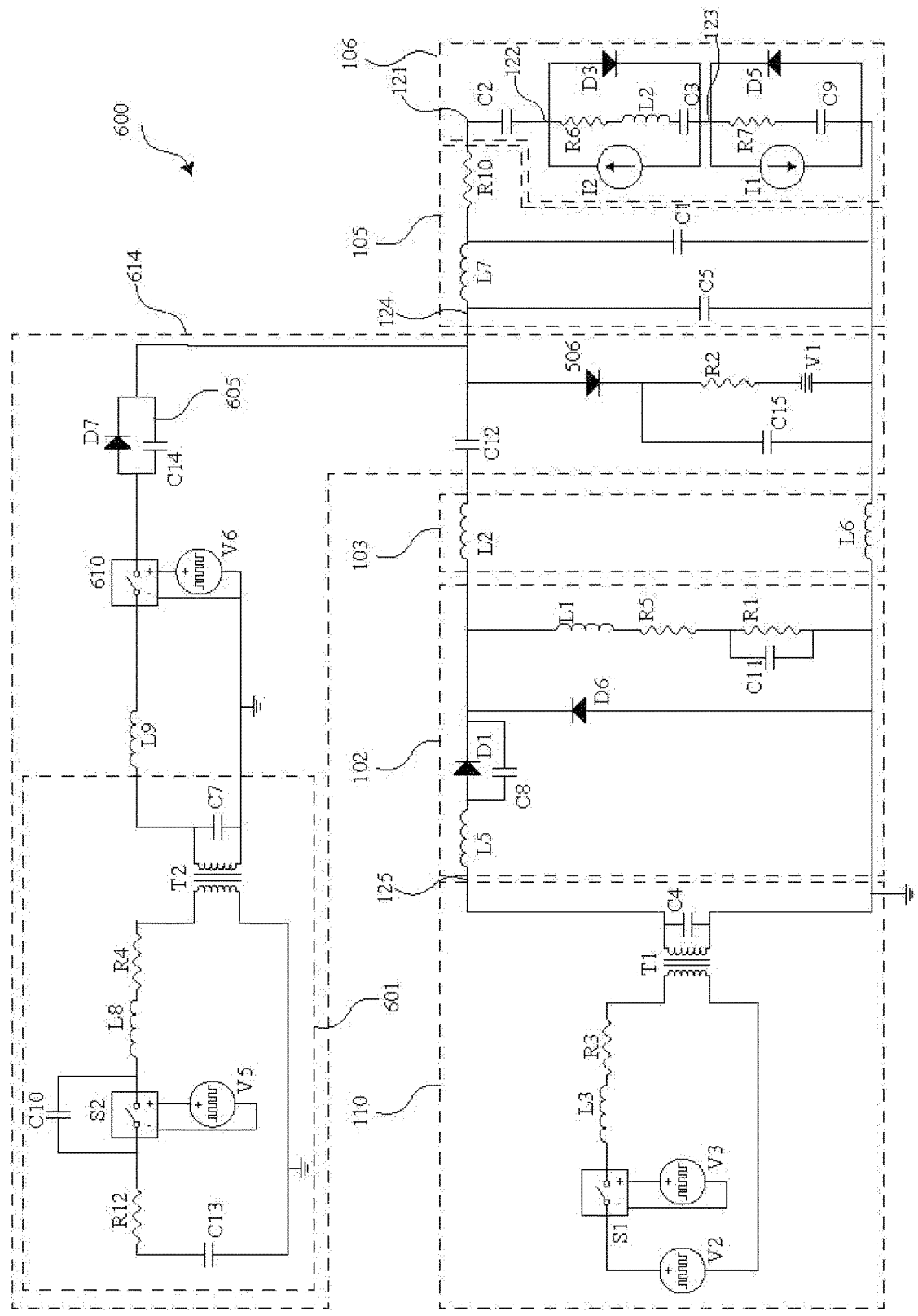
FIG. 6 is a circuit diagram of a high voltage power system with a plasma load according to some embodiments.

FIG. 6 is a circuit diagram of a high voltage power system with a plasma load 600 according to some embodiments. The high voltage power system with a plasma load 600 includes a bias compensation circuit 614 that includes a second pulser 601 and switch 610.

The bias compensation circuit 614, can include a second pulser 601. The second pulser 601, for example, may include one or more or all the components of the pulser and transformer stage 101 shown in either FIG. 1 or FIG. 3. For example, the pulser and transformer stage 101 may include a nanosecond pulser or a high voltage switch as disclosed in this document (e.g., FIG. 7 and related paragraphs). In some embodiments, the second pulser 601 may be configured to turn off when the pulser stage 101 is pulsing (e.g., during bursts), and the second pulser 601 may be configured to turned on when the pulser stage 101 is not pulsing (e.g., in between bursts)

The bias compensation circuit 614 may also include inductor L9 on the secondary side of the transformer T2 and switch 610 may be coupled with voltage source V6. The inductor L9 may represent the stray inductance of the bias compensation circuit 614 and may have a low inductance such as, for example, an inductance less than about 500 nH, 250 nH, 100 nH, 50 nH, 25 nH, etc. In some embodiments, the voltage source V6 may represent a trigger for the switch 610.

In some embodiments, the bias compensation circuit 614 may include a blocking diode D7. The blocking diode D7, for example, may ensure current flows from the switch 610 to the load stage 106. The capacitor C14, for example, may represent the stray capacitance of the blocking diode D7. The capacitance of capacitor C14, for example, may have a low capacitance such as, for example, less than about 1 nF, 500 pF, 200 pF, 100 pF, 50 pF, 25 pF, etc.

In some embodiments, the switch 610 may be open while the pulser and transformer stage 101 is pulsing and closed when the pulser and transformer stage 101 is not pulsing to offset (or bias) the voltage provided by the pulser stage.

In some embodiments, the switch 610 may include a plurality of switches arranged in series to collectively open and close high voltages. In some embodiments, the switch 610 may include the high voltage switch 700 described in FIG. 7. As another example, the high voltage switch 505 may, for example, include any switch described in U.S. patent application Ser. No. 16/178,565, filed Nov. 1, 2018, titled "High Voltage Switch with Isolated Power," which is incorporated into this disclosure in its entirety for all purposes.

Figure 7:
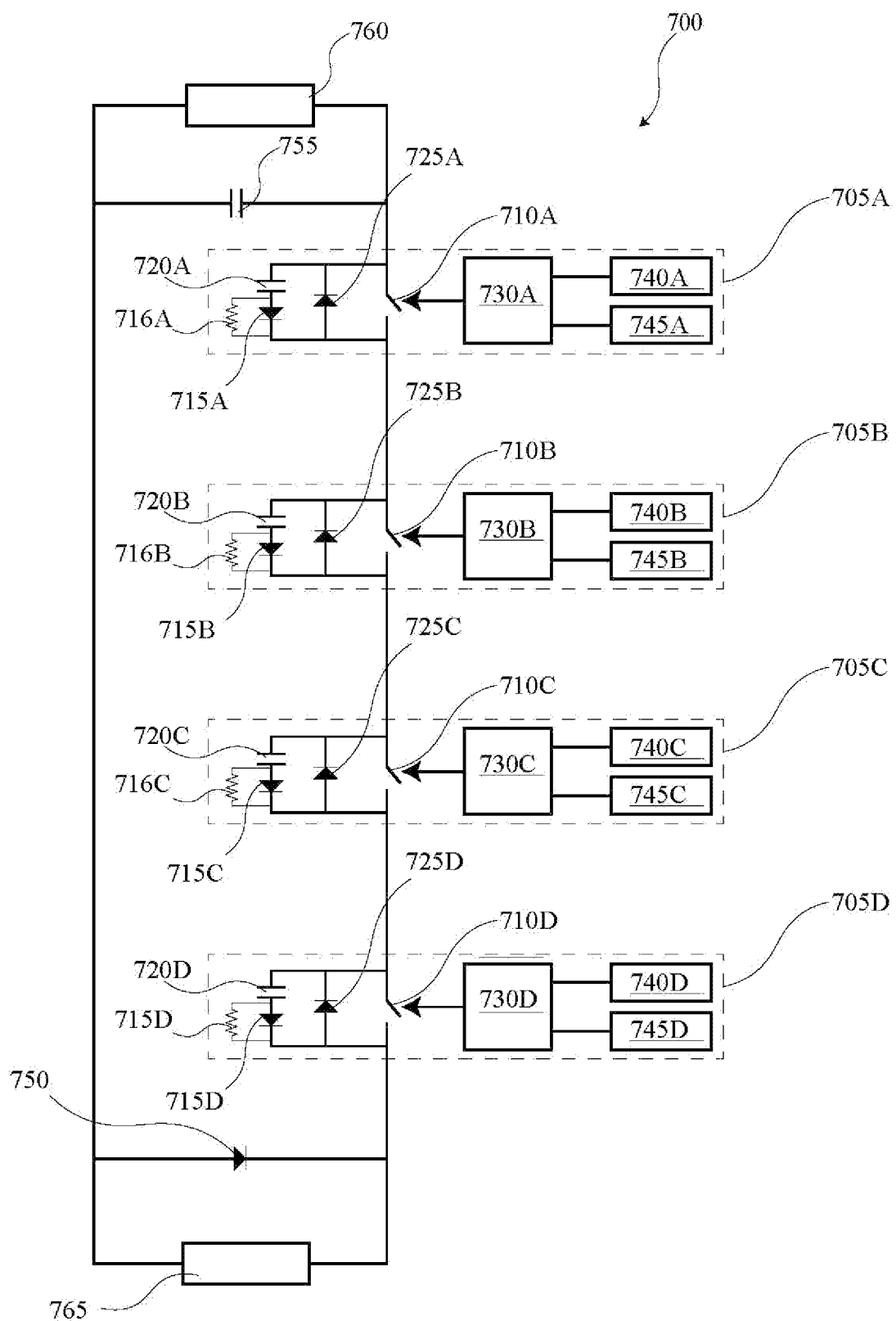
FIG. 7 is a block diagram of a high voltage switch with isolated power according to some embodiments.

FIG. 7 is a block diagram of a high voltage switch 700 with isolated power according to some embodiments. The high voltage switch 700 may include a plurality of switch modules 705 (collectively or individually 705, and individually 705A, 705B, 705C, and 705D) that may switch voltage from a high voltage source 760 with fast rise times and/or high frequencies and/or with variable pulse widths. Each switch module 705 may include a switch 710 such as, for example, a solid state switch.

In some embodiments, the switch 710 may be electrically coupled with a gate driver circuit 730 that may include a power supply 740 and/or an isolated fiber trigger 745 (also referred to as a gate trigger or a switch trigger). For example, the switch 710 may include a collector, an emitter, and a gate (or a drain, a source, and a gate) and the power supply 740 may drive the gate of the switch 710 via the gate driver circuit 730. The gate driver circuit 730 may, for example, be isolated from the other components of the high voltage switch 700.

In some embodiments, the power supply 740 may be isolated, for example, using an isolation transformer. The isolation transformer may include a low capacitance transformer. The low capacitance of the isolation transformer may, for example, allow the power supply 740 to charge on fast time scales without requiring significant current. The isolation transformer may have a capacitance less than, for example, about 100 pF. As another example, the isolation transformer may have a capacitance less than about 30-100 pF. In some embodiments, the isolation transformer may provide voltage isolation up to 1 kV, 5 kV, 10 kV, 25 kV, 50 kV, etc.

In some embodiments, the isolation transformer may have a low stray capacitance. For example, the isolation transformer may have a stray capacitance less than about 1,000 pF, 100 pF, 10 pF, etc. In some embodiments, low capacitance may minimize electrical coupling to low voltage components (e.g., the source of the input control power) and/or may reduce EMI generation (e.g., electrical noise generation). In some embodiments, the transformer stray capacitance of the isolation transformer may include the capacitance measured between the primary winding and secondary winding.

In some embodiments, the isolation transformer may be a DC to DC converter or an AC to DC transformer. In some embodiments, the transformer, for example, may include a 110 V AC transformer. Regardless, the isolation transformer can provide isolated power from other components in the high voltage switch 700. In some embodiments, the isolation may be galvanic, such that no conductor on the primary side of the isolation transformer passes through or makes contact with any conductor on the secondary side of the isolation transformer.

In some embodiments, the transformer may include a primary winding that may be wound or wrapped tightly around the transformer core. In some embodiments, the primary winding may include a conductive sheet that is wrapped around the transformer core. In some embodiments, the primary winding may include one or more windings.

In some embodiments, a secondary winding may be wound around the core as far from the core as possible. For example, the bundle of windings comprising the secondary winding may be wound through the center of the aperture in the transformer core. In some embodiments, the secondary winding may include one or more windings. In some embodiments, the bundle of wires comprising the secondary winding may include a cross section that is circular or square, for example, to minimize stray capacitance. In some embodiments, an insulator (e.g., oil or air) may be disposed between the primary winding, the secondary winding, or the transformer core.

In some embodiments, keeping the secondary winding far from the transformer core may have some benefits. For example, it may reduce the stray capacitance between the primary side of the isolation transformer and secondary side of the isolation transformer. As another example, it may allow for high voltage standoff between the primary side of the isolation transformer and the secondary side of the isolation transformer, such that corona and/or breakdown is not formed during operation.

In some embodiments, spacings between the primary side (e.g., the primary windings) of the isolation transformer and the secondary side of the isolation transformer (e.g., the secondary windings) can be about 0.1", 0.5", 1",5", or 10". In some embodiments, typical spacings between the core of the isolation transformer and the secondary side of the isolation transformer (e.g., the secondary windings) can be about 0.1", 0.5",1",5", or 10". In some embodiments, the gap between the windings may be filled with the lowest dielectric material possible such as, for example, vacuum, air, any insulating gas or liquid, or solid materials with a relative dielectric constant less than 3.

In some embodiments, the power supply 740 may include any type of power supply that can provide high voltage standoff (isolation) or have low capacitance (e.g., less than about 1,000 pF, 100 pF, 10 pF, etc.). In some embodiments, the control voltage power source may supply 720 V AC or 240 V AC at 60 Hz.

In embodiments, each power supply 740 may be inductively electrically coupled with a single control voltage power source. For example, the power supply 740A may be electrically coupled with the power source via a first transformer; the power supply 740B may be electrically coupled with the power source via a second transformer; the power supply 740C may be electrically coupled with the power source via a third transformer; and the power supply 740D may be electrically coupled with the power source via a fourth transformer. Any type of transformer, for example, may be used that can provide voltage isolation between the various power supplies.

In some embodiments, the first transformer, the second transformer, the third transformer, and the fourth transformer may comprise different secondary winding around a core of a single transformer. For example, the first transformer may comprise a first secondary winding, the second transformer may comprise a second secondary winding, the third transformer may comprise a third secondary winding, and the fourth transformer may comprise a fourth secondary winding. Each of these secondary winding may be wound around the core of a single transformer. In some embodiments, the first secondary winding, the second secondary winding, the third secondary winding, the fourth secondary winding, or the primary winding may comprise a single winding or a plurality of windings wound around the transformer core.

In some embodiments, the power supply 740A, the power supply 740B, the power supply 740C, and/or the power supply 740D may not share a return reference ground or a local ground.

The isolated fiber trigger 745, for example, may also be isolated from other components of the high voltage switch 700. The isolated fiber trigger 745 may include a fiber optic receiver that allows each switch module 705 to float relative to other switch modules 705 and/or the other components of the high voltage switch 700, and/or, for example, while allowing for active control of the gates of each switch module 705.

In some embodiments, return reference grounds or local grounds or common grounds for each switch module 705, for example, may be isolated from one another, for example, using an isolation transformer.

Electrical isolation of each switch module 705 from common ground, for example, can allow multiple switches to be arranged in a series configuration for cumulative high voltage switching. In some embodiments, some lag in switch module timing may be allowed or designed. For example, each switch module 705 may be configured or rated to switch 1 kV, each switch module may be electrically isolated from each other, and/or the timing of closing each switch module 705 may not need to be perfectly aligned for a period of time defined by the capacitance of the snubber capacitor and/or the voltage rating of the switch.

In some embodiments, electrical isolation may provide many advantages. One possible advantage, for example, may include minimizing switch to switch jitter and/or allowing for arbitrary switch timing. For example, each switch 710 may have switch transition jitters less than about 500 ns, 50 ns, 20 ns, 5 ns, etc.

In some embodiments, electrical isolation between two components (or circuits) may imply extremely high resistance between two components and/or may imply a small capacitance between the two components.

Each switch 710 may include any type of solid state switching device such as, for example, an IGBT, a MOSFET, a SiC MOSFET, SiC junction transistor, FETs, SiC switches, GaN switches, photoconductive switch, etc. The switch 710, for example, may be able to switch high voltages (e.g., voltages greater than about 1 kV), with high frequency (e.g., greater than 1 kHz), at high speeds (e.g., a repetition rate greater than about 500 kHz) and/or with fast rise times (e.g., a rise time less than about 25 ns) and/or with long pulse lengths (e.g., greater than about 10 ms). In some embodiments, each switch may be individually rated for switching 1,200 V-1,700 V, yet in combination can switch greater than 4,800 V-6,800 V (for four switches). Switches with various other voltage ratings may be used.

There may be some advantages to using a large number of lower voltage switches rather than a few higher voltage switches. For example, lower voltage switches typically have better performance: lower voltage switches may switch faster, may have faster transition times, and/or may switch more efficiently than high voltage switches. However, the greater the number of switches the greater the timing issues that may be required.

The high voltage switch 700 shown in FIG. 7 includes four switch modules 705. While four are shown in this figure, any number of switch modules 705 may be used such as, for example, two, eight, twelve, sixteen, twenty, twenty-four, etc. For example, if each switch in each switch module 705 is rated at 1200 V, and sixteen switches are used, then the high voltage switch can switch up to 19.2 kV. As another example, if each switch in each switch module 705 is rated at 1700 V, and sixteen switches are used, then the high voltage switch can switch up to 27.2 kV.

In some embodiments, the high voltage switch 700 may include a fast capacitor 755. The fast capacitor 755, for example, may include one or more capacitors arranged in series and/or in parallel. These capacitors may, for example, include one or more polypropylene capacitors. The fast capacitor 755 may store energy from the high voltage source 760.

In some embodiments, the fast capacitor 755 may have low capacitance. In some embodiments, the fast capacitor 755 may have a capacitance value of about 1 µF, about 5 µF, between about 1 µF and about 5 µF, between about 100 nF and about 1,000 nF etc.

In some embodiments, the high voltage switch 700 may or may not include a crowbar diode 750. The crowbar diode 750 may include a plurality of diodes arranged in series or in parallel that may, for example, be beneficial for driving inductive loads. In some embodiments, the crowbar diode 750 may include one or more Schottky diodes such as, for example, a silicon carbide Schottky diode. The crowbar diode 750 may, for example, sense whether the voltage from the switches of the high voltage switch is above a certain threshold. If it is, then the crowbar diode 750 may short the power from switch modules to ground. The crowbar diode, for example, may allow an alternating current path to dissipate energy stored in the inductive load after switching. This may, for example, prevent large inductive voltage spikes. In some embodiments, the crowbar diode 750 may have low inductance such as, for example, 1 nH, 10 nH, 100 nH, etc. In some embodiments, the crowbar diode 750 may have low capacitance such as, for example, 100 pF, 1 nF, 10 nF, 100 nF, etc.

In some embodiments, the crowbar diode 750 may not be used such as, for example, when the load 765 is primarily resistive.

In some embodiments, each gate driver circuit 730 may produce less than about 1000 ns, 100 ns, 10.0 ns, 5.0 ns, 3.0 ns, 1.0 ns, etc. of jitter. In some embodiments, each switch 710 may have a minimum switch on time (e.g., less than about 10 µs, 1 µs, 500 ns, 100 ns, 50 ns, 10, 5 ns, etc.) and a maximum switch on time (e.g., greater than 25 s, 10 s, 5 s, 1 s, 500 ms, etc.).

In some embodiments, during operation each of the high voltage switches may be switched on and/or off within 1 ns of each other.

In some embodiments, each switch module 705 may have the same or substantially the same (±5%) stray inductance. Stray inductance may include any inductance within the switch module 705 that is not associated with an inductor such as, for example, inductance in leads, diodes, resistors, switch 710, and/or circuit board traces, etc. The stray inductance within each switch module 705 may include low inductance such as, for example, an inductance less than about 300 nH, 100 nH, 10 nH, 1 nH, etc. The stray inductance between each switch module 705 may include low inductance such as, for example, an inductance less than about 300 nH, 100 nH, 10 nH, 1 nH, etc.

In some embodiments, each switch module 705 may have the same or substantially the same (±5%) stray capacitance. Stray capacitance may include any capacitance within the switch module 705 that is not associated with a capacitor such as, for example, capacitance in leads, diodes, resistors, switch 710 and/or circuit board traces, etc. The stray capacitance within each switch module 705 may include low capacitance such as, for example, less than about 1,000 pF, 100 pF, 10 pF, etc. The stray capacitance between each switch module 705 may include low capacitance such as, for example, less than about 1,000 pF, 100 pF, 10 pF, etc.

Imperfections in voltage sharing can be addressed, for example, with a passive snubber circuit (e.g., the snubber diode 715, the snubber capacitor 720, and/or the freewheeling diode 725). For example, small differences in the timing between when each of the switches 710 turn on or turn off or differences in the inductance or capacitances may lead to voltage spikes. These spikes can be mitigated by the various snubber circuits (e.g., the snubber diode 715, the snubber capacitor 720, and/or the freewheeling diode 725).

A snubber circuit, for example, may include a snubber diode 715, a snubber capacitor 720, a snubber resistor 716, and/or a freewheeling diode 725. In some embodiments, the snubber circuit may be arranged together in parallel with the switch 710. In some embodiments, the snubber capacitor 720 may have low capacitance such as, for example, a capacitance less than about 100 pF.

In some embodiments, the high voltage switch 700 may be electrically coupled with or include a load 765 (e.g., a resistive or capacitive or inductive load). The load 765, for example, may have a resistance from 50 ohms to 500 ohms. Alternatively or additionally, the load 765 may be an inductive load or a capacitive load.

Figure 8:
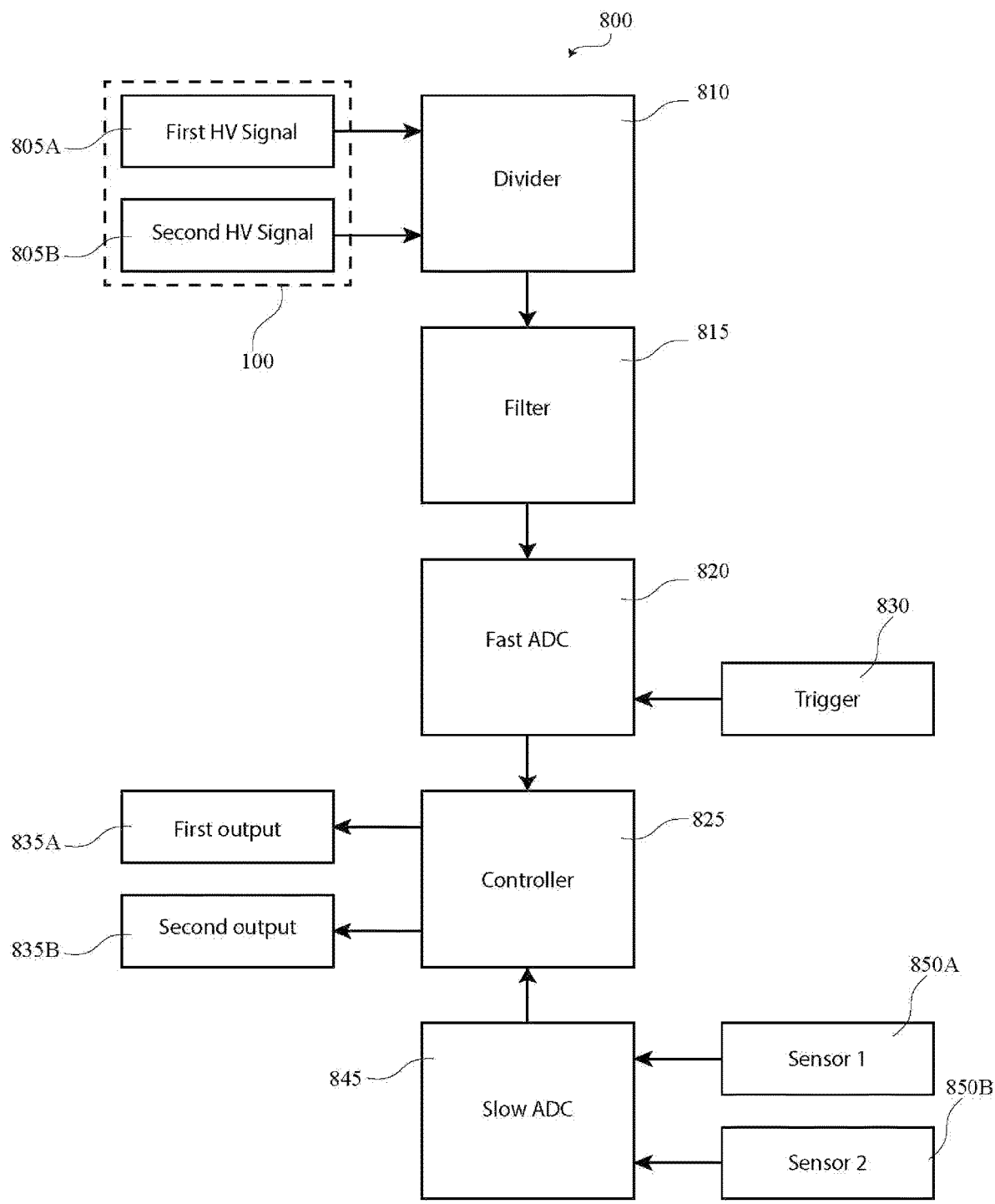
FIG. 8 is a block diagram of an ADC control system for a nanosecond pulser system according to some embodiments.

FIG. 8 is a block diagram of an ADC control system 800 for a nanosecond pulser system 100 (or nanosecond pulser system 300) according to some embodiments. In some embodiments, the ADC control system 800 may be electrically coupled with the nanosecond pulser system 100 at one or more locations. For example, a first HV signal 805A may include the voltage signal at point 120 of the nanosecond pulser system 100, which is between the pulser and transformer stage 101 and the bias compensation circuit 104. As another example, a second HV signal 805B may include the voltage signal at point 125 of the nanosecond pulser system 100, which is between the load stage 106 and the bias compensation circuit 104. In some embodiments, the first HV signal 805A and the second HV signal 805B may include the voltage signals on each side of the capacitor C12 of the bias compensation circuit 104. Any number of other signals may be received.

In some embodiments, the first HV signal 805A or the second HV signal 805B may include the voltage signals provided to the load stage 106. In some embodiments, the first HV signal 805A or the second HV signal 805B may include the voltage signals provided to the bias compensation circuit 104. In some embodiments, the first HV signal 805A or the second HV signal 805B may include the voltage signals provided to the lead stage 103. In some embodiments, the first HV signal 805A or the second HV signal 805B may include the voltage signals provided to the pulser and transformer stage 101 may be measured. In some embodiments, the first HV signal 805A or the second HV signal 805B may include the voltage signals provided to the resistive output stage 102.

The first HV signal 805A and the second HV signal 805B collectively or individually may be referred to as the HV input signal 805.

In some embodiments, the HV input signal 805 may divided at voltage divider 810. The voltage divider 810, for example, may include high value resistors or low value capacitors to divide the high voltage HV input signal (e.g., greater than 1 KV) to a low voltage signal (e.g., less than 50 V). The voltage divider 810, for example, may divide the voltage with a 500:1 ratio. The voltage divider 810, for example, may divide the HV input signal 805 voltage of 0-10 kV to a voltage of 0-20 V. The voltage divider 810, for example, may divide the voltage with minimal power loss such as, for example, less than about 5 W of power loss.

In some embodiments, the voltage divider 810 may include a low value capacitor, a large value capacitor, a low value resistor, and a large value resistor. The low value capacitor, for example, may comprise a capacitor that has a capacitance value of about 0.1, 0.5, 1.0, 2.5, 5.0, 10.0 pf, etc. The large value capacitor, for example, may comprise a capacitor that has a capacitance value of about 500 pf. In some embodiments, the large value capacitor may have a capacitance value that is about 50, 100, 250, 500, 1,000, 2,500, 5,000 pF, etc. greater than the capacitance value of the low value capacitor.

The low value resistor may have a resistance value of about 1.0, 2.5, 5.0, 10, 25, 50, 100 kΩ, etc. The large value resistor may have a resistance value of about 0.5, 1.0, 2.5, 5.0, 10, 25, 50, 100 MΩ, etc. In some embodiments, the large value resistor may have a resistance value that is about 50, 100, 250, 500, 1,000, 2,500, 5,000 pF, etc. greater than the resistance value of the low value resistor. In some embodiments, the ratio of the low value capacitor to the large value capacitor may be substantially the same as the ratio of the low value resistor to the large value resistor.

In some embodiments, the voltage divider 810 may receive the HV input signal and output a divided voltage signal. The divided voltage signal, for example, may be 100, 250, 500, 750, 1,000, etc. times smaller than the HV input signal.

In some embodiments, a filter 815 may be included such as, for example, to filter out any noise from the divided voltage signal.

In some embodiments, the divided voltage signal may be digitized by the first ADC 820. Any type of analog to digital converter may be used. The first ADC 820 may produce a digitized waveform signal. In some embodiments, the first ADC 820 may capture data at 100, 250, 500, 1,000, 2,000, 5,000 MSPS (megasamples per second or millions of samples per second). In some embodiments, the digitized waveform signal may be communicated to the controller 825 using any type of communication protocol such as, for example, SPI, UART, RS-232, USB, I2C, etc.

In some embodiments, the controller 825 may comprise any type of controller such as, for example, an FPGA, ASIC, complex programmable logic device, microcontroller, system on a chip (SoC), or any combination thereof. In some embodiments, the controller 825 may include any or all the components of the computational system 1500. In some embodiments, the controller 825 may include a standard microcontroller such as, for example, Broadcom Arm Cortex, Intel ARM Cortex, PIC32, etc.

In some embodiments, the controller 825 may receive a trigger signal from trigger 830. In other embodiments, the first ADC 820 may receive the trigger signal from trigger 830. The trigger signal may provide the timing of data acquisition at the first ADC 820. The trigger signal, for example, may be a 5V TTL trigger. The trigger signal, for example, may have a 50 ohm termination.

The digitized signal may then be output from the controller 825 via one or more output ports such as, for example, a first output 835A or a second output 835B (individually or collectively output 835). These outputs may be coupled with a nanosecond pulser controller. Either or both the output 835 may include an electrical connecter such as, for example, an LVDS, TTL, LVTTL connector. Either or both the output 835 may provide data to the nanosecond pulser controller using any type of communication protocol such as, for example, SPI, UART, RS-232, USB, I2C, EtherCAT, Ethernet, Profibus, PROFINET.

In some embodiments, the ADC control system 800 may couple with the nanosecond pulser system 100 via a 8 mm Multilam receptacles on the ADC control system 800.

In some embodiments, the second ADC 845 and the first ADC 820 may comprise a single ADC device. In some embodiments, either or both the second ADC 845 or the first ADC 820 may be part of the controller 825. In some embodiments, the first ADC 820 may operate at a higher acquisition rate than the second ADC 845.

In some embodiments, the ADC control system 800 may include a second ADC 845, which may receive inputs from a first sensor 850A and a second sensor 850B (individually or collectively sensor 850) (or any number of sensors). In some embodiments, the second ADC 845 may digitize analog signals from the sensors 850. The sensors 850 may include, for example, a sensor that senses inlet water temperature, dielectric fluid temperature, dielectric fluid pressure, chassis air temperature, voltage, fluid flow, fluid leak sensor, etc.

In some embodiments, the ADC control system 800 may monitor the voltage, frequency, pulse width, etc. of a given waveform and, in response, may adjust the voltage, pulse repetition frequency, pulse width, burst repetition frequency (where a burst includes a plurality of pulses), etc. provided to the input of the nanosecond pulser system 100. For example, the first ADC 820 may monitor the voltage amplitude of a waveform. This voltage data may be provided to the nanosecond pulser controller. The nanosecond pulser controller may adjust the amplitude or frequency of the signal provided to the nanosecond pulser system 100.

In some embodiments, the ADC control system 800 may output arbitrary pulse signals via output 835 to one or more nanosecond pulser systems 100. The output 835, for example, may include either fiber or electric connections. In some embodiments, ADC control system 800 can include a plurality of output pulse channels (e.g., 1, 2, 5, 8, 20, 50, 100, etc.) that may, for example, be independent from each other. The plurality of output pulse channels may, for example, output pulses with sub-nanosecond resolution.

For example, if the waveform voltage is less than a predetermined voltage, the first ADC 820 may send a signal to the nanosecond pulser system 100 to produce a waveform with a higher voltage. If the waveform voltage is greater than a predetermined voltage, the first ADC 820 may send a signal to the nanosecond pulser system 100 to produce a waveform with a lower voltage.

As another example, if the pulse repetition frequency is greater than an anticipated pulse repetition frequency, the first ADC 820 may send a signal to the nanosecond pulser system 100 to produce a waveform with a lower frequency. If the burst repetition frequency is less than an anticipated burst repetition frequency, the first ADC 820 may send a signal to the nanosecond pulser system 100 to produce a waveform with a higher pulse repetition frequency.

As another example, if the waveform pulse width is longer than an anticipated pulse width, the first ADC 820 may send a signal to the nanosecond pulser system 100 to produce a waveform with a shorter or longer pulse width. If the waveform duty cycle is shorter or longer than an anticipated duty cycle, the first ADC 820 may send a signal to the nanosecond pulser system 100 to produce a pulses with the appropriate duty cycle.

The ADC control system 800 may monitor other waveform characteristics and/or adjust these other characteristics.

In some embodiments, the ADC control system 800 may output arbitrary pulse signals via output 835 to one or more nanosecond pulser systems 100. For example, the ADC control system may comprise an arbitrary pulse generator. The output 835, for example, may include either fiber or electric connections. In some embodiments, ADC control system 800 can include a plurality of output pulse channels (e.g., 1, 2, 5, 8, 20, 50, 100, etc.) that may, for example, be independent from each other. The plurality of output pulse channels may, for example, output pulses with sub-nanosecond resolution. In some embodiments, the ADC control system 800 may output pulses with resolution less than about 0.1 ns. In some embodiments, the ADC control system 800 may output pulses with jitter less than about 100 ps.

In some embodiments, each output pulse channel of the ADC control system 800 may output pulses to a nanosecond pulser system 100 that triggers the nanosecond pulser system 100. The ADC control system 800 may, for example, adjust parameters of the output pulses in real-time or between pulses. These parameters may include pulse width, pulse repetition frequency, duty cycle, burst repetition frequency, voltage, number of pulses in a burst, the number of burst, etc. In some embodiments, one or more parameters may be adjusted or changed based on input to the ADC control system 800 or based on a recipe or program.

For example, a recipe may include alternating high bursts and low bursts. A high burst, for example, may include a plurality of pulses having long pulse width. A low burst, for example, may include a plurality of pulses having short pulse widths. The high burst and the low burst may, for example, include the same number of burst or different number of bursts. A short pulse width, for example, may be 20%, 30%, 80%, 50%, etc. the width of the long pulse width. The alternating high bursts and low bursts may include 5%, 20%, 50%, 100%, 125%, 150%, etc. low bursts in relation to the number of high bursts.

In some embodiments, the control system 800 can adjust the pulse width, duty cycle, or pulse repetition frequency in conjunction with the different steps of a plasma processing recipe, where each stage of the recipe may correspond to different ion current, chamber pressure, or different gas in the chamber. Adjusting the pulse width, duty cycle, or pulse repetition frequency, may adjust the electric field and/or voltage at the wafer surface to optimize the performance of each step of the recipe.

In some embodiments, the ADC control system 800 comprises an electrical shield. An electrical shield, for example, can separate the high voltage components from the low voltage components. An electrical shield, for example, may be disposed physically between the voltage divider 810 and the controller 825 or the first ADC 820. As another example, the electric shield may be disposed physically between the nanosecond pulser system 100 and the controller 825 or the first ADC 820.

In some embodiments, the electric shield may be disposed physically between resistors in the voltage divider 810. In some embodiments, the electric shield may be disposed physically between capacitors in the voltage divider 810.

In some embodiments, the electrical shield may comprise copper, nickel. In some embodiments, the electrical shield may comprise sheet metal, metal screen, or metal foam.

In some embodiments, the ADC control system 800 may monitor the sensors 850 and take action. A number of examples are provided below.

In some embodiments, a nanosecond pulser system may include a cooling subsystem. In some embodiments, the cooling subsystem may include a fluid, such as, for example, either water or a dielectric fluid, that flows through the cooling subsystem to remove heat from the nanosecond pulser system 100 (e.g., as shown in FIGS. 11-14). For example, one of the sensors 850 may include a flow rate sensor for fluid in the cooling system. If the controller 825 determines the flow rate is below a flow rate threshold, the ADC control system 800 will not allow the nanosecond pulser system 100 to turn on. If the controller 825 determines the flow rate is below a flow rate threshold, the ADC control system 800 will automatically turn off the nanosecond pulser system 100. In some embodiments, the flow rate sensor (in some cases with the controller 825) may be a flow rate interlock. A flow rate interlock, for example, may prevent the nanosecond pulser system 100 from turning on or may turn off the nanosecond pulser system 100, if it is already on, if the flow rate is below the flow rate threshold.

For example, one of the sensors 850 may include a thermometer coupled with the cooling subsystem. If the controller 825 determines the temperature of the cooling subsystem (e.g., the temperature of the fluid) is above a water temperature threshold, the ADC control system 800 will not allow the nanosecond pulser system 100 to turn on. If the controller 825 determines the temperature of the water is above the water temperature threshold, the ADC control system 800 will automatically turn off the nanosecond pulser system 100. A temperature interlock, for example, may prevent the nanosecond pulser system 100 from turning on or may turn off the nanosecond pulser system 100, if it is already on, if the temperature is above the water temperature threshold.

For example, one of the sensors 850 may include a liquid level sensor for a fluid reservoir in a cooling system. If the controller 825 determines the reservoir liquid level is above a liquid level threshold, the ADC control system 800 will not turn on. If the controller 825 determines the reservoir liquid level is above the liquid level threshold, the ADC control system 800 will automatically turn off the nanosecond pulser system 100. A liquid level interlock, for example, may prevent the nanosecond pulser system 100 from turning on or may turn off the nanosecond pulser system 100, if it is already on, if the liquid level is below the liquid level threshold.

In some embodiments, the nanosecond pulser system 100 may include a nitrogen purge subsystem that pumps nitrogen into the nanosecond pulser system. The nitrogen purge system, for example, may introduce dry nitrogen into an enclosure within which the high voltage nanosecond pulser system is disposed. For example, one of the sensors 850 may include a nitrogen pressure sensor. If the controller 825 determines the nitrogen pressure level is below a pressure threshold the ADC control system 800 will not turn on. If the controller 825 determines the nitrogen pressure level is below the pressure threshold the ADC control system 800 will automatically turn off the nanosecond pulser system 100. A pressure interlock, for example, may prevent the nanosecond pulser system 100 from turning on or may turn off the nanosecond pulser system 100, if it is already on, if the pressure is below the pressure threshold.

In some embodiments, one of the sensors 850 may include a DC voltage sensor that may be coupled with a DC power supply in the nanosecond pulser system 100. For example, if multiple DC power supply systems are used in nanosecond pulser system 100 and during operation the voltage varies by more than a set percentage (e.g., 1%, 5%, 10%, 20%, etc.) or more than an absolute voltage (e.g., 5V, 10V, 50V, 100V, etc.) then the ADC control system 800 may automatically turn off the nanosecond pulser system 100. As another example, if power supply systems are used and during operation the voltage output differs by more than a percentage from a set voltage (e.g., 1%, 5%, 10%, 20%, etc.) or more than an absolute voltage from the set voltage (e.g., 5V, 10V, 50V, 100V, etc.) then the ADC control system 800 may automatically turn off pulsing.

In some embodiments, output 835 may include an EtherCat module that may communicate with a third party system (e.g., an external system). In some embodiments, the EtherCat module may comprise any type of communication module. In some embodiments, the EtherCat may include one or more components of the computational system 1500.

In some embodiments, the controller 825 may respond to the operation of one or more interlocks. An interlock may, for example, include a 24V interlock, a dry N2 pressure interlock, a water flow interlock, a dielectric flow interlock, a water reservoir level interlock, a water temperature interlock, a dielectric temperature interlock, etc.

In some embodiments, the control system may control the operation of a pulsing system such as, for example, pulse width, duty cycle, high voltage set point, on/off, returns current output voltage, high voltage current set point, returns current output current, enable high voltage output, returns high voltage enable state, emergency shutdown, etc.

In some embodiments, a user may interface with the control system through an EtherCat module. A user, for example, may issue a PW command to set the output pulse width. As another example, user may issue DUTY command to set the duty cycle. As another example, a user may issue a PWR command to turn the power on and begin operation of unit or off to end operation of the unit. As another example, the unit may continue to operate as set until issued another command to change duty cycle, pulse width, or issued another PWR command to shut off.

In some embodiments, the ADC control system 800 may receive commands from an external source in any type of communication protocols such as, for example, EtherCAT, LXI, Ethernet, Profibus, PROFINET, RS-232, ModBus, USB, UART, SPI, CC-Lin, etc.

Figure 9:
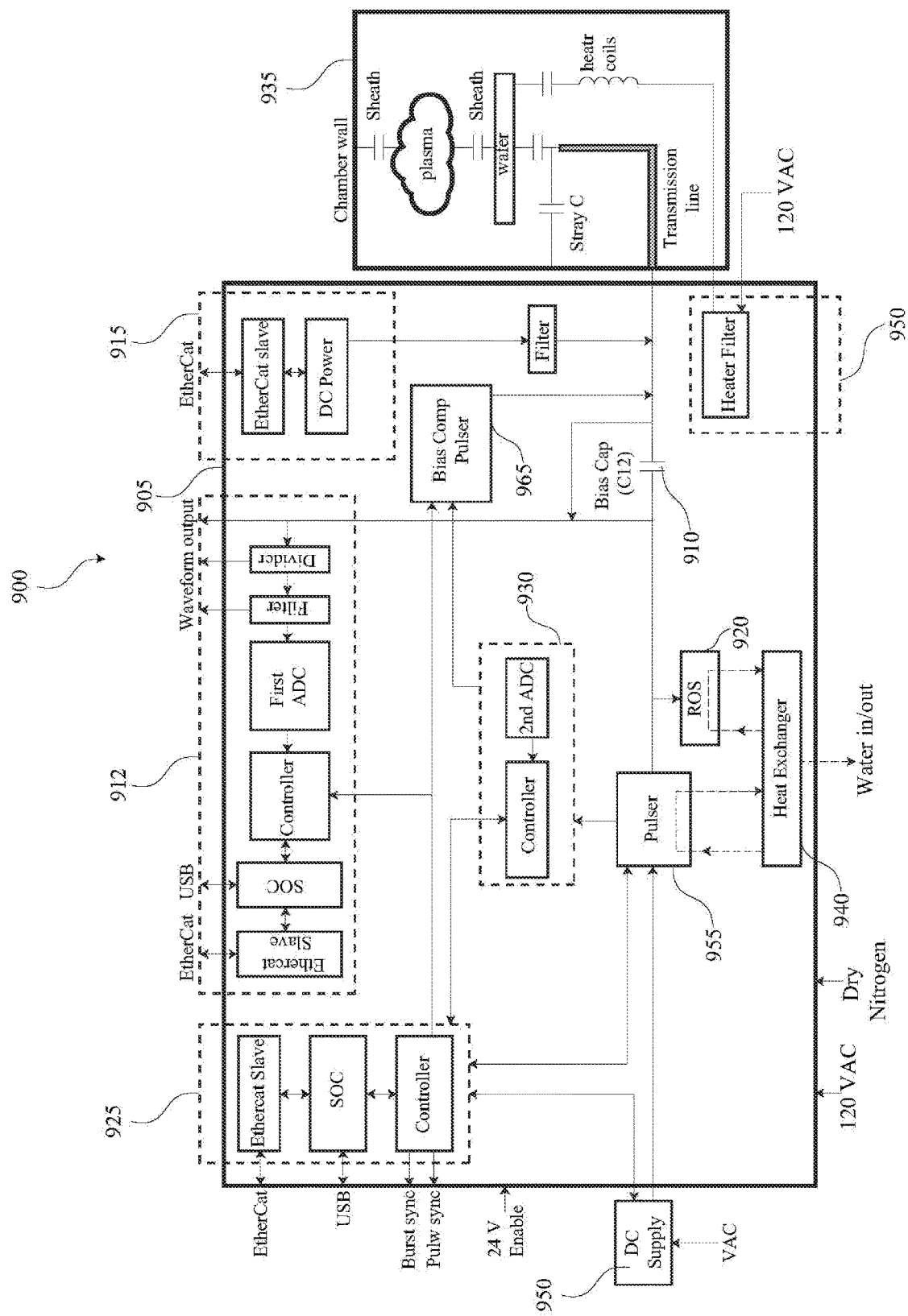
FIG. 9 is a functional block diagram of a nanosecond pulser system according to some embodiments.

FIG. 9 is a functional block diagram of a nanosecond pulser system 900 according to some embodiments. In some embodiments, the nanosecond pulser system 900 may include all or some of the components shown or arranged in nanosecond pulser system 100 and/or nanosecond pulser system 150.

In some embodiments, the nanosecond pulser system 900 may include a chassis 905 within which some of the components are enclosed. In some embodiments, the nanosecond pulser system 900 may include an ADC control module 912. The ADC control module 912 may include all or some of the components shown in the ADC control system 800.

In some embodiments, the nanosecond pulser system 900 may include a bias compensation module 965 (e.g., all or some of the components of bias compensation circuit 104, bias compensation circuit 514 or bias compensation circuit 614) and/or a bias capacitor 910 (e.g., capacitor C12).

In some embodiments, the nanosecond pulser system 900 may include a heat exchanger subsystem 940.

In some embodiments, the nanosecond pulser system 900 may include a high voltage DC power supply 950. The high voltage DC power supply may supply DC power to bias compensation module 965 or nanosecond pulser 955.

In some embodiments, the nanosecond pulser system 900 may include a resistive output stage 920 (e.g., resistive output stage 102). In some embodiments, the nanosecond pulser system 900 may include any or all components, arrangements, functionality, etc. shown and/or described in U.S. patent application Ser. No. 15/941,931, titled "High Voltage Resistive Output Stage Circuit" filed on Mar. 30, 2018, which is incorporated in its entirety herein for all purposes.

In some embodiments, the nanosecond pulser system 900 may include an energy recovery circuit 165 as shown in FIG. 3.

In some embodiments, the nanosecond pulser system 900 may include an HVM module 915. In some embodiments, the HVM module 915 may include an EtherCat slave module and/or a high voltage DC power supply module. The HVM module 915 may include various connectors or ports for communication with external systems.

In some embodiments, the nanosecond pulser system 900 may include a control module 925. The control module 925 may include EtherCat slave module, a system on a chip module, and/or an FPGA.

In some embodiments, the nanosecond pulser system 900 may include a second ADC module 930. The second ADC module 930 may include a microcontroller (e.g., all or a portion of controller 825) and/or an analog to digital converter (e.g., second ADC 845). The microcontroller, for example, may include any or all the components shown in computational system 1500.

In some embodiments, the nanosecond pulser system 900 may have a modular design so that various modules may be easily replaced or repaired. For example, the nanosecond pulser system 900 may include a Power Entry module, an AC Heater Filters module, a Fast ADC module, a Control Module, and/or an HVM. These modules, for example, may be slide in modules. As another example, the nanosecond pulser system 900 may include other modules such as, for example, the resistive output stage resistor and/or inductor modules, the thermal management system, and/or nanosecond pulsers. These modules may be accessed via removal or opening one or more covers on the body of the system.

In some embodiments, the nanosecond pulser system 900 may include a pulse bias generation (PBG) module. This module may produce output pulses at up to 8 kV and 900 kHz. This module, for example, may include two or more nanosecond pulsers and/or a resistive output stage.

In some embodiments, the nanosecond pulser system 900 may include an spatially variable wafer bias power system (e.g., any or all of the components of the spatially variable wafer bias power system 400). In some embodiments, this module may be a smaller version of the pulse bias generation subsystem, such as, for example, scaled to about 25% power. In some embodiments, this module may drive the edge of the wafer separately from the central portion of the wafer. Various other implementations may be used where different spatial regions of the wafer may be pulsed independently of each other.

In some embodiments, the nanosecond pulser system 900 may include an HVM module (e.g., a slide-in module). In some embodiments, this module may provide a DC chucking voltage.

In some embodiments, the nanosecond pulser system 900 may include an AC Heater Filter module (e.g., a slide-in module). In some embodiments, this module may filter the AC power going to the heater elements to minimize ground leakage current and avoid drawing excess power from the PBG through the heater elements to ground.

In some embodiments, the nanosecond pulser system 900 may include control module and/or second ADC (e.g., a slide-in module). In some embodiments, this module may allow for the system to be controlled via EtherCat. In some embodiments, this module may interface with external DC supplies to control charge voltage and current. In some embodiments, this module may monitor internal sensors (e.g., temperature, flow, status, etc.) to ascertain system status.

In some embodiments, the nanosecond pulser system 900 may include power distribution (e.g., a slide-in module). In some embodiments, this module may provide an interface to plug in external power (e.g., HVDC and 3 phase 208V). In some embodiments, this module may include an ACDC supply to generate the needed control voltages for other modules inside the P1 chassis. In some embodiments, this module may provide a power distribution network to get the needed voltages to the needed modules in the system.

In some embodiments, the nanosecond pulser system 900 may include a chassis. In some embodiments, the chassis may include a mechanical assembly holding all the modules. In some embodiments, the chassis may provide an RF seal so that no EMI can enter or leak out of the system. In some embodiments, the chassis may be modular and/or include a removal front cover to allow access to system internal components. In some embodiments, the chassis may allow "slide-in" modules from the side to be easily replaced as needed.

In some embodiments, the nanosecond pulser system 900 may include thermal management subsystem 1000, which may include a heat exchanger, a plurality of fluid lines, and a plurality of cold plates. In some embodiments, the thermal management subsystem may provide cooling to other system components. In some embodiments, the thermal management subsystem may include cooling water (e.g., 5 gpm or more). In some embodiments, the thermal management subsystem may include a heat exchanger so that dielectric coolant can be circulated internally to the system, which may, for example, eliminate issues of arcing/capacitive coupling that would occur if water was used throughout. In some embodiments, the thermal management subsystem may include cold plates for the switches and cores on the NSPs, and for the ROS and snubber resistors.

In some embodiments, the nanosecond pulser system 900 may include a sensors subsystem. In some embodiments, the sensor subsystem may provide all the needed sensors to monitor the status and operation of the system. In some embodiments, the sensor subsystem may include temperature sensors that measure the temperature of key components (e.g., switches, cores, resistors, etc.) and/or of the dielectric fluid in the thermal management subsystem. In some embodiments, the sensor subsystem may include flow/pressure sensors that may verify that the coolant is circulating properly and/or is not leaking. In some embodiments, the sensor subsystem may include a sensor to verify the flow of nitrogen within the system, which may, for example, be necessary to prevent condensation.

Figure 10:
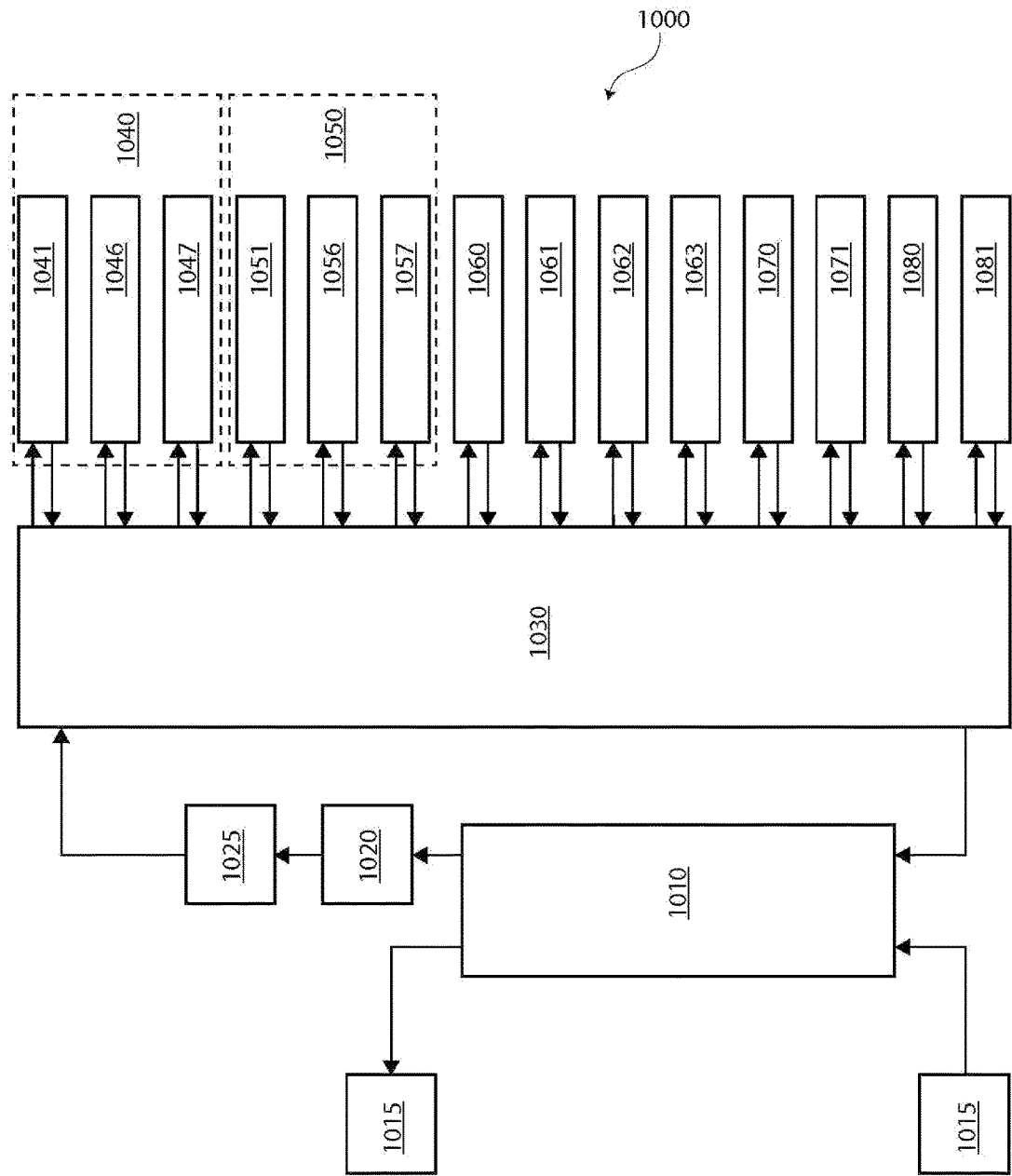
FIG. 10 is a block diagram of the thermal management system according to some embodiments.

FIG. 10 is a block diagram of the thermal management system 1000 according to some embodiments. In some embodiments, the thermal management system 1000 may include a main manifold 1005 and a heat exchanger 1010. The heat exchanger 1010 may exchange heat between the cold side and the hot side of the thermal management system. The hot side may be fluidically coupled with any number of cold plates such that hot system fluid returned from the cold plates may be cooled by facility fluid within the heat exchanger 1010. In some embodiments, system fluid may include water, dielectric fluid, dielectric fluid Galden HT110, deionized water, glycol/water solutions, aromatic based dielectric fluids (e.g., DEB), silicate-ester based dielectric fluids (e.g., as Coolanol 25R), aliphatic based dielectric fluids (e.g., PAO), silicone based dielectric fluids (e.g., Syltherm XLT), fluorocarbon based dielectric fluids (e.g., FC-77), ethylene glycol, propylene glycol, methanol/water, potassium formate/acetate solutions, etc. In some embodiments, the facility fluid may include water such as, for example, tap water.

In some embodiments, the facility side of the heat exchanger 1010 may receive facility fluid (e.g., water) from an external fluid source 1015. In some embodiments, the external fluid source 1015 may include a fluid inlet and a fluid outlet. In some embodiments, the external fluid source 1015 may include a facility fluid thermal management system. In some embodiments, the external fluid source may include one or more pumps to ensure facility fluid is flowing through the external fluid source including the heat exchanger 1010.

In some embodiments, the heat exchanger 1010, for example, may exchange heat from a hot side (e.g., various board components) to a cold side (e.g., a facility). In some embodiments, the cold side may include a facility fluid (e.g., water) and the hot side may include a system fluid (e.g., dielectric fluid). In some embodiments, the hot side may include one or more switch cold plates 1041, 1051, one or more core cold plates 1046, 1047, 1056, 1057, one or more resistor cold plates 1060, 1061, 1062, 1063, snubber resistor cold plate 1070, 1071, one or more liquid to air heat exchangers 1080, 1081, a pump 1025, and/or a reservoir 1020, etc. The hot side may be a fully contained system. The cold side may be coupled with an external fluid supply and/or a thermal management system. In some embodiments, the system fluid may be circulated faster than the facility fluid (e.g., twice as fast). In some embodiments, the system fluid may flow at a rate of about 1 to 100 gallons per minute or the facility fluid may flow at a rate of about 1 to 100 gallons per minute. In some embodiments, the heat exchanger 1010 may facilitate heat exchange between the hot side and the cold side without transferring fluid between the hot side and the cold side.

In some embodiments, the hot side of the heat exchanger 1010 may be coupled with the cold plates, the reservoir 1020, the pump 1025, or the main manifold 1030 such as, for example, via one more pipes or tubes.

In some embodiments, the heat exchanger 1010 may include a scalable plate heat exchanger. In some embodiments, the heat exchanger 1010 may include a shell and tube heat exchanger. In some embodiments, the heat exchanger 1010 may include a double pipe heat exchanger.

In some embodiments, the reservoir 1020 may allow for expansion or contraction of the system fluid as the various components of the high voltage nanosecond pulser system heat up under operation. In some embodiments, the reservoir 1020 may store excess system fluid to keep the pump 1025 from potentially running dry. In some embodiments, the reservoir 1020 may be constructed in any number of ways such as, for example, as a welded steel container or a polymer container. In some embodiments, the reservoir 1020 may have a customized shape that can be sized or shaped to fit in any configuration or space. In some embodiments, the reservoir 1020 may have an opening on the top of the reservoir 1020 to allow the reservoir 1020 to be filled with additional system fluid. In some embodiments, the reservoir 1020 may include a pressure relief valve that can automatically open or close to allow pressure from within the reservoir to escape. In some embodiments, the reservoir 1020 may include multiple chambers or compartments that may be useful to separate bubbles or reduce disturbances in the flow of the system fluid.

In some embodiments, the pump 1025 may pump system fluid through the heat exchanger 1010, the reservoir 1020, the main manifold 1030, tubes, pipes, or other components. The pump 1025, for example, may pump the system fluid with a flow rate of about 10-30 gallons per minute or about 15-20 gallons per minute. In some embodiments, the pump may pump the system fluid with a flow rate of about 18 gallons per hour. In some embodiments, the pump 1025 may comprise a magnetic drive pump, centrifugal pump, regenerative turbine pump, mechanical seal pump, etc. In some embodiments, the pump 1025 may include a variable frequency drive motor pump or a conventional single speed centrifugal pump. In some embodiments, the pump may be wired so that the pump turns on automatically when the entire system it powered on.

Figure 11:
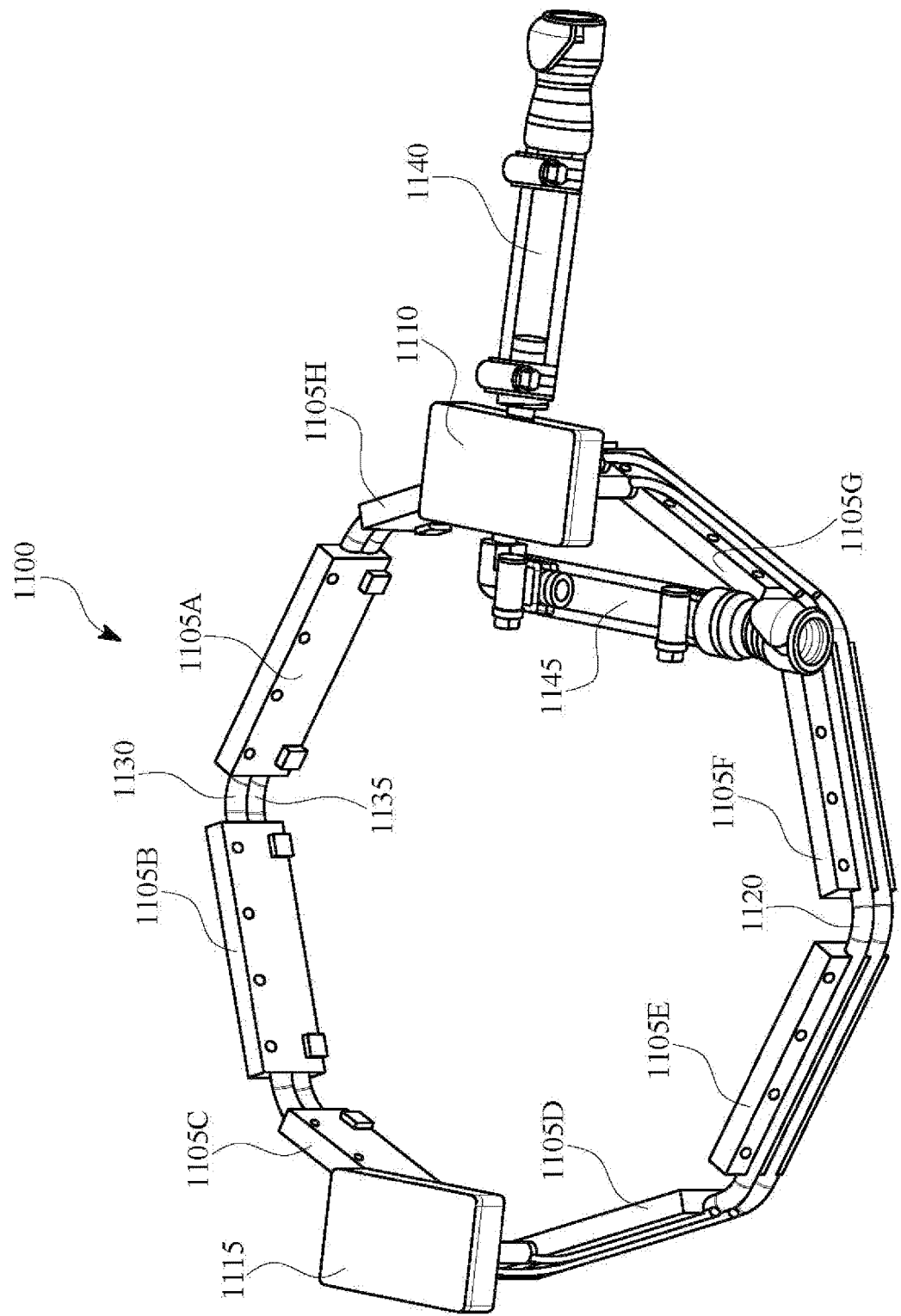
FIG. 11 illustrates embodiments and/or arrangements of a switch cold plate system according to some embodiments.
Figure 12:
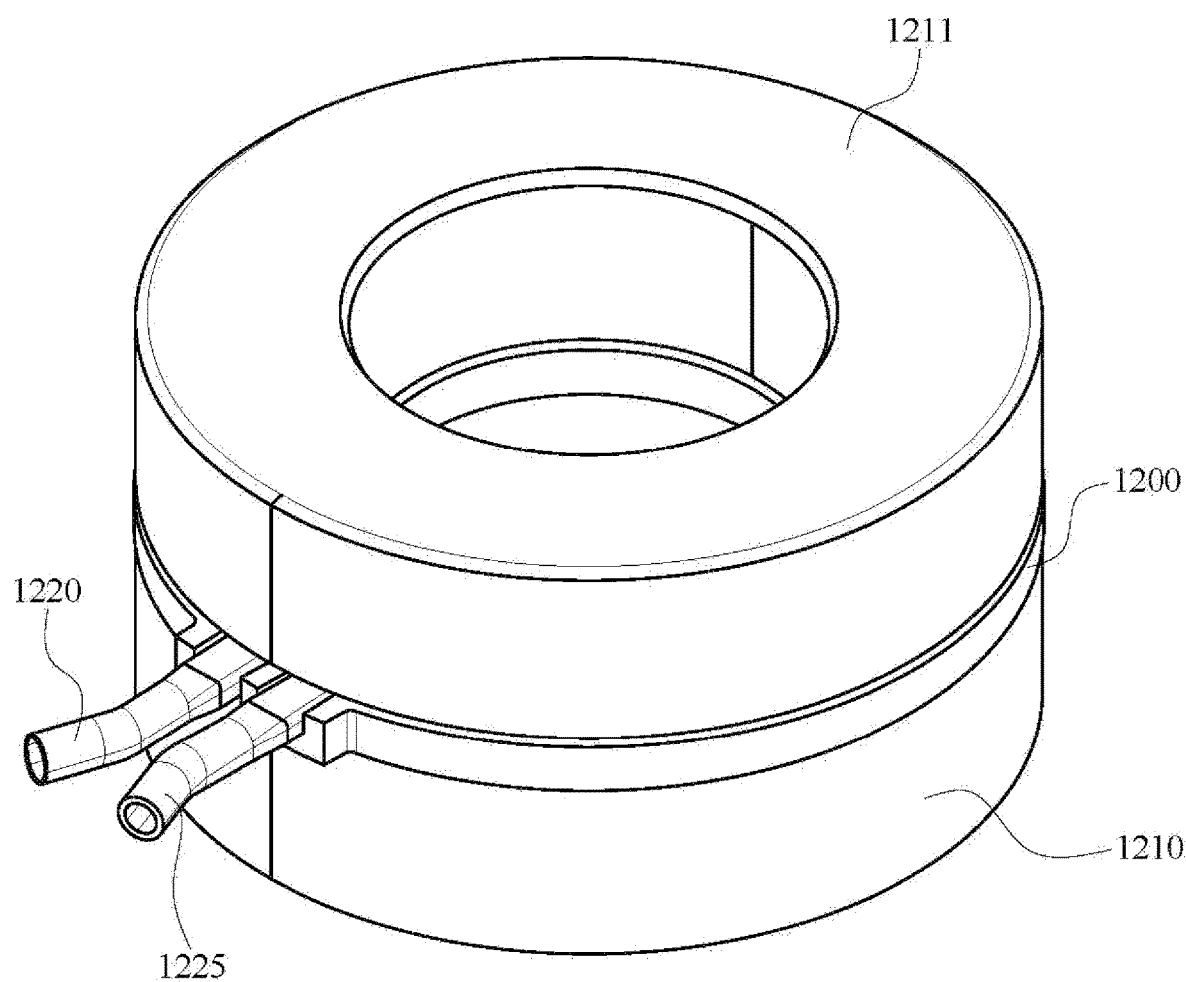
FIG. 12 illustrate embodiments and/or arrangements of a cold plate according to some embodiments.
Figure 13:
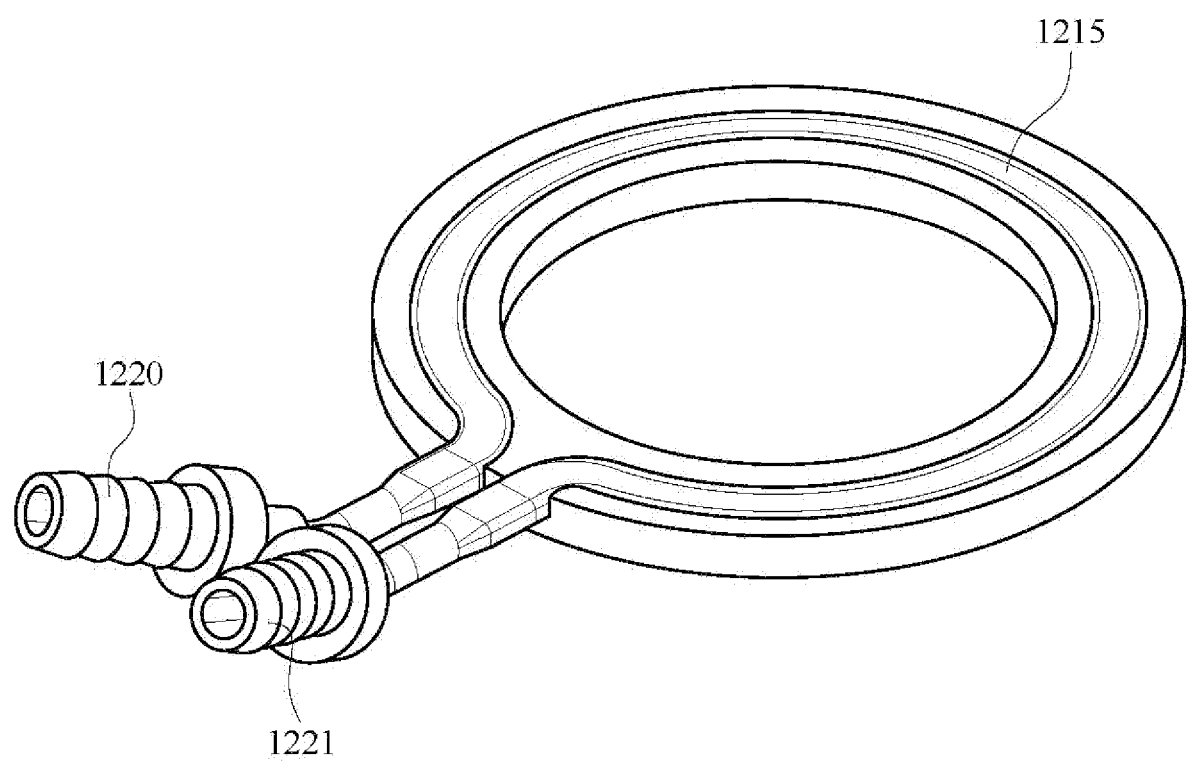
FIG. 13 illustrate embodiments and/or arrangements of a cold plate according to some embodiments.
Figure 14:
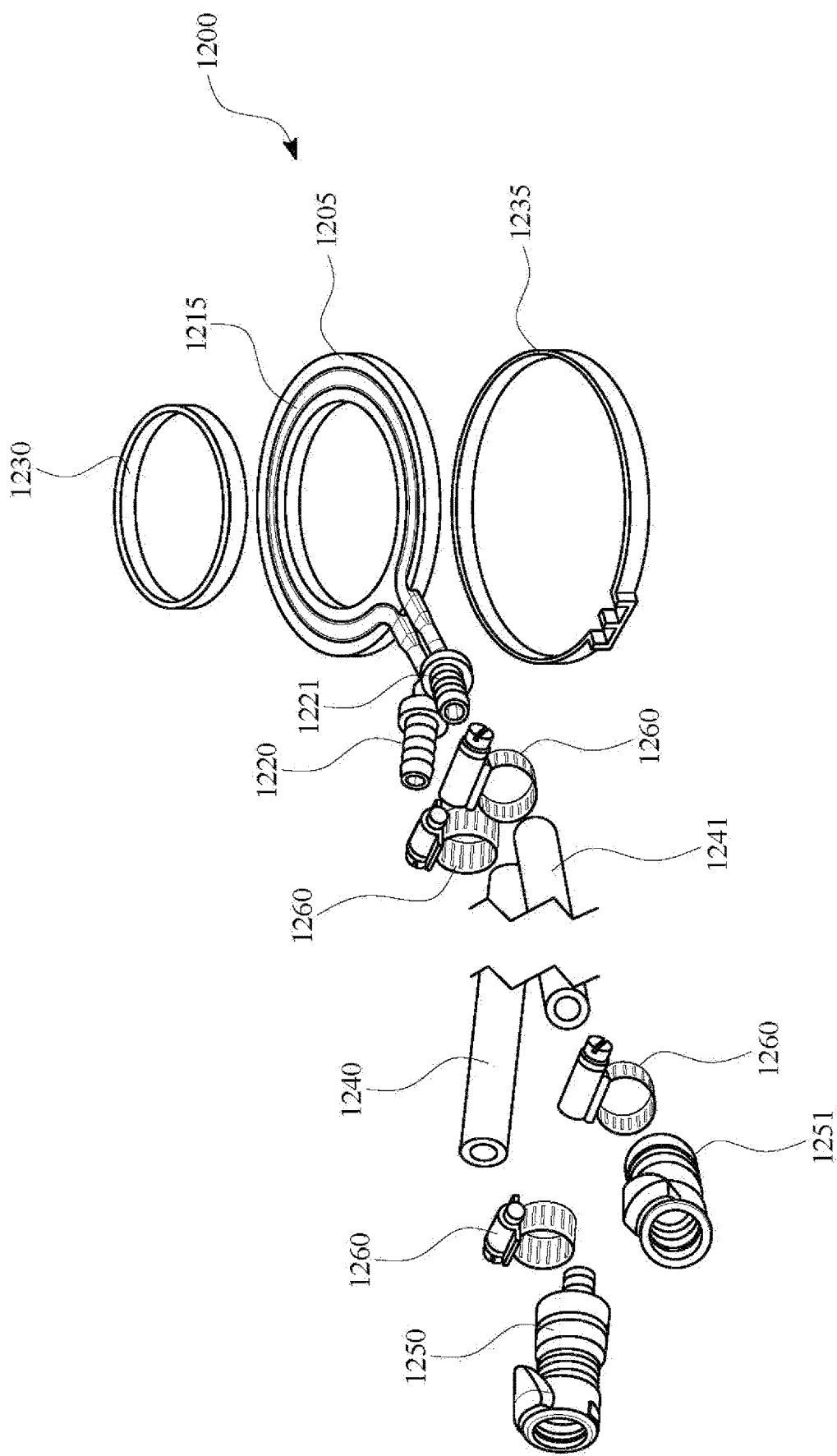
FIG. 14 illustrate embodiments and/or arrangements of a cold plate according to some embodiments.

In some embodiments, the main manifold 1030 may distribute system fluid among any number of cold plates. For example, the cold plates can include one or more switch cold plates 1041, 1051. Examples of switch cold plates are shown in FIG. 11. For example, the cold plates can include one or more core cold plates 1046, 1047, 1056, 1057. Examples of core cold plates are shown in FIGS. 12, 13, and 14.

In some embodiments, the core cold plates can interface with a toroid transformer core to provide optimal cooling while minimizing the impact on transformer performance. In some embodiments, the core cold plates may include inner or outer insulating rings so that a continuous conductive sheet primary winding of the transformer can be insulated from the core cold plate. In some embodiments, a core cold plate can be made of either a tube press fit into an aluminum ring or a larger diameter copper tube can be flattened into a ring shape so that there are less materials interacting. As another example, the core cold plate can be made from a solid piece of copper with a groove machined out of the inside to create an internal "tube" where then another piece of metal such as copper is then brazed on to the top.

For example, the cold plates can include one or more resistor cold plates 1060, 1061, 1062, 1063, one or more snubber resistor cold plates 1070, 1071. Examples of the resistor cold plates and snubber resistor cold plates are shown in FIGS. 11 and 12. In some embodiments, the resistor cold plates may include machined or brazed copper so that resistor cold plates can be as thin as possible while handling high pressures/velocities.

For example, the cold plates can include or one or more liquid to air heat exchangers 1080, 1081. The one or more liquid to air heat exchangers 1080, 1081 may cool air that circulates inside of the nanosecond pulser system. Fans disposed within the nanosecond pulser system may circulate this cool air through components that do not have liquid-cooled cold plates attached to them. For example, the heat exchanger may be used to cool of diodes, gate drive circuits, switching regulators, etc.

In some embodiments, the main manifold 1030 may include a plurality of interconnected orifices coupled with a plurality of connectors. The plurality of connectors can be used to connect tubes with the various components. In some embodiments, each of the plurality of connectors may include a quick connect connectors for ease of assembly, disassembly, or maintenance. In some embodiments, each of the plurality of connectors may include barb connectors which may produce less drag on the system fluid. In some embodiments, the manifold may have orifices of different sizes to allow for different fluid flow rates to different components.

In some embodiments, the cold plates may include various cold plates that can be configured or adapted to couple with various components. In some embodiments, the cold plates may be designed using computational fluid dynamics (CFD) to ensure proper cooling based on the specific operating conditions (e.g., steady state flow rate, pressure, temperature, etc.) or geometry of each component.

In some embodiments, the switch cold plates and the core cold plates may be designed and used to minimize size, stray capacitance, or stray inductance while removing as much heat as possible in a uniform way from each component.

In some embodiments, a core cold plate may introduce less than about 10 pF, 1 pF, 100 nF, 10 nF, etc. of stray capacitance. For example, the stray capacitance measured between secondary winding and ground with the core cold plate in place is less than about 10 nF (or about 10 pF, 1 pF, 100 nF) greater than the stray capacitance between secondary winding and ground without the core cold plate.

In some embodiments, a core cold plate may introduce less than about 1 nH, 10 nH, 100 nH, 1 μH, 10 μH, etc. of stray inductance as measured on the secondary side. For example, the stray inductance measured on the secondary side of the transformer with the core cold plate may be less than 10 μH greater than the stray inductance on the secondary side of the transformer without the core cold plate. As another example, the stray inductance measured on the primary side of the transformer with the core cold plate may be less than 10 nH greater than the stray inductance on the secondary side of the transformer without the core cold plate.

In some embodiments, a switch cold plate may introduce less than about 10 nF of capacitance. For example, a switch may include a heat sink. A switch cold plate may be coupled with the heat sink. A first capacitance between the switch heat sink and ground may be determined without the switch cold plate coupled with the heat sink. A second capacitance between the switch heat sink and ground may be determined with the switch cold plate coupled with the heat sink. The difference between the first capacitance and the second capacitance may be less than about 10 pF-10 nF of capacitance such as, for example, less than about 5 nF of capacitance. As another example, the stray capacitance between a switch cold plate and ground with the switch cold plate coupled with a switch heat sink is less than 5 nF greater than the stray capacitance between the switch heat sink and ground with the first switch cold plate removed.

In some embodiments, the switch cold plate may be coupled with the switch heat sink such that the switch cold plate and the switch heat sink are at the same potential. This may also electrically couple the switch cold plate to the collector (for an IGBT) or the drain (for a MOSFET) because the heat sink in switches can be connected to the collector or drain.

In some embodiments, a thermal (or electrical) insulating material may be disposed between a switch and switch cold plate.

In some embodiments, the switch cold plate and/or the core cold plate may have a geometry that is minimized.

In some embodiments, the various cold plates may be connected to the main manifold 1030 in series or in parallel.

In this example, two circuit boards 1040, 1050 are included that include a pulser and transformer stage (e.g., pulser and transformer stage 101) and a transformer core included on each board. Each board may include one or more switch cold plates that may be in contact with one more switches (e.g., switch S1 in FIG. 1) and/or one or more core cold plates that may be in contact with one transformer cores (e.g., transformer T2 of FIG. 1). A plurality of resistor cold plates are coupled with the resistive output stage resistors (e.g., resistor R1 in FIG. 1), and the snubber resistors (e.g., resistor R3 in FIG. 1). Each of these cold plates may be fluidically connected with the main manifold via copper or plex tubing. In some embodiments, the tubing may have a pipe size of about 0.1", 0.2", 0.5", etc.

In some embodiments, thermal interface materials may be used to bridge the gap between electrical components (e.g., switches, resistors, transformer cores, etc.) and a cold plate (e.g., one or more switch cold plates 1041, 1051, one or more core cold plates 1046, 1047, 1056, 1057, one or more resistor cold plates 1060, 1061, 1062, 1063, snubber resistor cold plate 1070, 1071, one or more liquid to air heat exchangers 1080, 1081). In some embodiments, thermal interface materials may be placed between tubing and a cold plate (e.g., one or more switch cold plates 1041, 1051, one or more core cold plates 1046, 1047, 1056, 1057, one or more resistor cold plates 1060, 1061, 1062, 1063, snubber resistor cold plate 1070, 1071, one or more liquid to air heat exchangers 1080, 1081).

In some embodiments, thermal interface materials, for example, can be very thin (e.g., as thin as 0.0005" and up to a thickness of 0.1"), to minimize thermal resistance. In some embodiments, thermal interface materials can have more thickness or uneven thicknesses, to bridge gaps between objects with uneven surfaces or to provide structural rigidity. Thermal interface materials, for example, may be solid, such as, for example, aluminum nitride, or may be deformable, such as, for example, conductive epoxy, thermal paste, or compressible thermal pads. Thermal interface materials can be electrically insulating or electrically conductive depending on application.

In some embodiments, a thermal epoxy can be used to mechanically and thermally attach the core cold plates to a transformer core. The thermal epoxy, for example, has a higher thermal conductivity than standard RTV. In some embodiments, thermally conductive tacky pads, which have a higher thermal conductivity than thermal epoxy but are less structural can be used to couple each switch with a switch cold plate. In some embodiments, clips can be affixed to a switch cold plate with screws. In some embodiments, a thin layer of thermal paste, which may be more thermally conductive than the tacky pads, can be used to couple a resistor and resistor core cold plates. In some embodiments, resistors can be screwed down to the resistor cold plate surface, which may provide a constant uniform pressure to optimize heat transfer.

FIG. 11 illustrates embodiments and/or arrangements of a switch cold plate system 1100 (e.g., switch cold plate 1041, 1051). The switch cold plate system 1100 may include a plurality of switch cold plates 1105A, 1105B, 1105C, 1105D, 1105E, 1105F, 1105G, 1105H (individually or collectively switch cold plate 1105) arranged in a circular or octagonal arrangement (e.g., arranged axial around a central point) to couple with a corresponding circular or octagonal arrangement of switches (e.g., arranged axial around a central point) (e.g., switch S1 in FIG. 1). The switch cold plates 1105 may be coupled together via tubing 1120, 1125. The tubing 1120, 1125 may, for example, conduct system fluid through the various switch cold plates 1105. In some embodiments, two parallel lines of tubing may connect the various switch cold plates 1105 and conduct system fluid between the switch cold plates 1105.

In some embodiments, each switch cold plate 1105 may comprise a first face and a second face. Each switch cold plate 1105 may include, for example, one or two channels (or grooves) cut through the second face that are sized and configured to securely couple with the tubing 1120, 1125 such as, for example, having channel diameter that is substantially similar to a tube diameter. In some embodiments, the first face may be substantially flat and may couple with a surface of a switch (e.g., a flat portion of a switch) using a thermal interface material such as, for example, a thermally conductive paste or adhesive (e.g., aluminum nitride). The channels, for example, may be physically coupled with the tubing using a thermal conductive interface such as, for example, a thermally conductive paste or adhesive (e.g., aluminum nitride). In some embodiments, the tubing 1120, 1125 may be press fit into the channel of each switch cold plate and/or then brazed to the inlet/outlet manifold 1110 or the loop back manifold 1115 creating an octagon that may be screwed to a circuit board where the switches are coupled.

In some embodiments, the second face of each switch cold plate 1105 may be attached with 1, 2, 4, 8, etc. switches such as, for example, via a thermally conductive paste or adhesive. In some embodiments, each switch cold plate 1105 may include one or more mounting holes that can be coupled with a switch.

In some embodiments, system fluid can enter the switch cold plate system 1100 via an inlet/outlet manifold 1110 by entering the inlet/outlet manifold 1110 via an inlet port 1140 and exit the inlet/outlet manifold 1110 via an outlet port 1145. In some embodiments, the inlet port 1140 may include an inlet connector. In some embodiments, the outlet port may include an outlet connector. In some embodiments, the inlet/outlet manifold 1110 may comprise an aluminum block of material. In some embodiments, the loop back manifold 1115 may comprise a metallic block of material such as, for example, aluminum, brass, bronze, or copper. In some embodiments, the loop back manifold 1115 may comprise a plastic.

In some embodiments, the inlet/outlet manifold 1110 may split the system fluid into two separate paths: a first path may conduct the system fluid through tubing 1120 coupled four switch cold plates 1105G, 1105F, 1105E, 1105D and back through tubing 1125 also coupled with these four switch cold plates 1105G, 1105F, 1105E, 1105D; and a second path may conduct the system fluid through tubing 1130 coupled with four switch cold plates 1105H, 1105A, 1105B, 1105C and back through tubing 1135 also coupled with these four switch cold plates 1105H, 1105A, 1105B, 1105C.

In some embodiments, the loop back manifold 1115 may receive the system fluid from the tubing 1120 and return the system fluid back through tubing 1125. In some embodiments, the loop back manifold 1115 may receive the system fluid from the tubing 1130 and return the system fluid back through tubing 1135. This arrangement, for example, may help to keep the temperature difference between the switches small and/or may reduce the number of fittings.

In some embodiments, a thermal interface material may be placed between tubing 1130 or tubing 1135 and each switch cold plate 1105.

In some embodiments, the inlet/outlet manifold 1110 may split the system fluid into a first path the conducts the system fluid in one direction through the various switch cold plates 1105 in a one tubing (e.g., tubing 1125) and a second path the conducts the system fluid in the opposite direction through the various switch cold plates 1105 in another tubing (e.g., tubing 1120) without the loop back manifold 1115.

In some embodiments, a switch cold plates may maintain the surface temperature of the various switches to a temperature less than about 250 C. In some embodiments, a switch cold plate may remove more than about 1 W of heat from each switch.

FIG. 12, FIG. 13, and FIG. 14 illustrate embodiments and/or arrangements of a cold plate 1200 (e.g., core cold plates 1046, 1047, 1056, 1057) according to some embodiments. In some embodiments, the core cold plate 1200 can provide thermal dissipation to one or more transformer cores such as, for example, a toroid shaped transformer core. In some embodiments, the core cold plate 1200 can be disposed between two transformer cores 1210, 1211: one transformer core 1210 on one side of the core cold plate 1200 and the other transformer core 1211 on the other side of the core cold plate 1200. In some embodiments, embodiments addition core cold plate may be disposed on the other sides of transformer cores 1210 and 1211.

In some embodiments, a system fluid may be pumped through the internal tube 1215 of the core cold plate 1200 at a rate of 0.1-10 gallons per minute.

In some embodiments, as shown in FIG. 13 and FIG. 14, the core cold plate 1200 may be made of a flat ring 1205 that may include internal tube 1215. In some embodiments, the flat ring 1205 may have a toroid or donut shape and have an inner aperture. In some embodiments, the flat ring may have an inner circumference or outer circumference. The flat ring 1205 may comprise any metal such as, for example, aluminum, brass, steel, bronze, copper, etc. In some embodiments, the internal tube 1215 may conduct the system fluid between the two transformer cores 1210, 1211. The internal tube 1215, for example, may include copper tubing.

In some embodiments, the core cold plate 1200 includes the flat ring 1205, the internal tube 1215, an inner ring 1230, or an outer ring 1235. In some embodiments, the inner ring 1230 or the outer ring 1235 may comprise plastic or any other insulating material. In some embodiments, the inner ring 1230 may have an outer circumference that is substantially similar to the inner circumference of the flat ring 1205. In some embodiments, the inner ring 1230 may be disposed within the inner aperture of the flat ring 1205. In some embodiments, the outer ring 1235 may have an inner circumference that is substantially similar to the outer circumference of the flat ring 1205.

In some embodiments, the aperture of the flat ring 1205, inner ring 1230, outer ring 1235, transformer core 1210, and transformer core 1211 can be substantially aligned such as, for example, along an axis through a central axis of each of the aperture of the flat ring 1205, inner ring 1230, outer ring 1235, transformer core 1210, and transformer core 1211.

In some embodiments, the inner ring 1230 or the outer ring 1235 may be attached to the inner and outer diameter of the transformer core to allow for standoff from any primary transformer windings and/or secondary transformer windings that may be wound around the transformer core. In some embodiments, the inner ring 1230 or the outer ring 1235 may reduce capacitive or inductive coupling between the core cold plate 1200 and any primary transformer windings and/or secondary transformer windings that may be wound around the transformer core.

In some embodiments, the internal tube 1215 may be coupled with inlet connector 1220 and outlet connector 1225. The inlet connector 1220 may be coupled with inlet tubing 1240, for example, with clamp 1260 (a metallic or plastic clamp), a quick disconnect device, or soldered to together. The inlet tubing 1240 may be coupled with connector 1250, for example, via clamp 1260. The connector 1250, for example, may connect with the main manifold 1030. The outlet connector 1225 may be coupled with outlet tubing 1241, for example, with clamp 1260. The outlet tubing 1241 may be coupled with connector 1251, for example, via clamp 1260. The connector 1251, for example, may connect with the main manifold 1030.

In some embodiments, a core cold plate may maintain the surface temperature of a transformer core to a temperature less than about 200 C. 25. In some embodiments, a core cold plate may remove more than about 1 W of heat from a transformer core.

In some embodiments, the transformer core may include a ferrite core. In some embodiments, the transformer core may comprise a toroid shape, a square shape, a rectangular shape, etc. In some embodiments, the transformer may comprise a cylindrical transformer.

In some embodiments, a thermal management system may include a number of sensors (e.g., sensors 850) such as, for example, pressure sensors within one or more system fluid lines, a heat sensor (e.g., a thermometer, thermistor, or thermocouple), liquid level sensor (e.g., within a reservoir), or flow meters. In some embodiments, a flow meter may be disposed within or in line with one or more of the system fluid tubes. In some embodiments, a flow meter may be disposed within or in line with one or more of the water tubes. In some embodiments, a heat sensor may be disposed within a system fluid tube, at the inlet/outlet manifold or the outlet port of the switch cold plate system.

In some embodiments, these sensors may provide data to a controller or an interlock system that can adjust flow rates of either or both the system fluid or the facility fluid such as, for example, by changing a pump speed or opening or closing various valves throughout the system. In some embodiments, a high voltage power supply may not turn on or may automatically turn off a certain sensor values (or averages) are or are not achieved.

In some embodiments, the temperature of the system fluid may be measured at the main manifold, before the heat exchanger, the pump output, a resistor cold plate, a core cold plate switch cold plate, a switch core cold plate, or any other location. In some embodiments, the air temperature within the high voltage power supply may be monitored using air temperature sensors such as, for example, surface mount sensors.

In some embodiments, the high voltage power supply may not turn on unless the flow rate of water is above a flow threshold such as, for example, above about 1, 2.5, 5, 7.5, or 10 gallons per minute. In some embodiments, the high voltage power supply may not turn on unless the flow rate of water is below a flow threshold such as, for example, below about 10, 20, 50, or 100 gallons per minute. The water flow rate, for example, may be measured at or near the water inlet port.

In some embodiments, the high voltage power supply may not turn on unless the flow rate of system fluid is above a flow threshold such as, for example, about 1, 2.5, 5, 7.5, or 10 gallons per minute. In some embodiments, the high voltage power supply may not turn on unless the flow rate of system fluid is below a flow threshold such as, for example, below about 10, 20, 50, or 100 gallons per minute. The system fluid flow rate, for example, may be measured at or near the pump.

In some embodiments, the high voltage power supply may not turn on if the input water temperature or the system fluid temperature is greater than a temperature threshold such as, for example, a temperature threshold of about 20 to 50 C, about 20 to 25 C, or about 20 C.

In some embodiments, the high voltage power supply may turn off if the input water temperature or the system fluid temperature is greater than a temperature threshold such as, for example, a temperature threshold of about 50 to 70 C, about 50 to 60 C, or about 50 C.

In some embodiments, the high voltage power supply may turn off if the system fluid level in the reservoir (e.g., reservoir) is less than a certain amount or less than a percentage full such as, for example, less than about 30% to 75%, about 30% to 50%, or about 30% full.

In some embodiments, the high voltage power supply may turn off if the temperature of system fluid exiting one or more switch cold plates is greater than a temperature threshold such as, for example, 50 to 75 C, about 50 to 55 C, or about 50 C.

In some embodiments, the high voltage power supply may turn off or not turn on if the pressure in the system fluid system is below a pressure threshold such as, for example, below about 0 to 1.5 bar, about 0.5 to 1 bar, or about 1 bar. In some embodiments, the high voltage power supply may turn off or not turn on if the pressure in the system fluid system is above a pressure threshold such as, for example, above about 1.7 to 3 bar, about 1.75 to 2 bar, about 1.75 bar. The pressure of the system fluid, for example, may be measured within any dielectric tubes or pipes coupled with the main manifold.

In some embodiments, the high voltage power supply may turn off or not turn on if the if the pressure from a nitrogen sensor is below a pressure threshold such as, for example, below the atmospheric pressure.

In some embodiments, the high voltage power supply may turn off or not turn on if the if a leak sensor indicates that a fluid leak (either the system fluid or the facility fluid) has occurred. The leak sensor, for example, may include an optical sensor that indicates the presence of liquid if the optical sensor is obscured.

In some embodiments, any of the sensors may comprise a switch sensor. A switch sensor, for example, may automatically close a switch in the event a sensed threshold has been met. The switch, for example, may open or close a circuit.

In some embodiments, a plurality of fans may be disposed within the high voltage nanosecond pulser system. For example, a plurality of fans may be used to circulate air within the high voltage nanosecond pulser system. In this example, the various fans are placed so that they create an air flow pattern that circulates chilled air from the bottom upwards around the side of various modules, such as, for example, through a control interconnect board, and back down to various heat exchangers that may be coupled to either or both the system fluid system or a facility fluid system.

An inert gas purge subsystem may be included according to some embodiments. In some embodiments, inert gas (e.g., nitrogen, helium, argon, etc.) may flow through the system to reduce the possibility of condensation developing on cooling components. In some embodiments, nitrogen may enter through an nitrogen bulkhead (e.g., on the bottom side of the chassis), pass through a filter, a nitrogen flow sensor, and out of an orifice limiter (e.g., limits the nitrogen flow to 10 liters per minute) into the high voltage nanosecond pulser system. In some embodiments, nitrogen may leave the chassis through another bulkhead, through gaps in the chassis or body, or at any another point in the chassis.

In some embodiments, a nanosecond pulser system can include an enclosure and one or more nanosecond pulsers with various subsystems can be located within the enclosure. For example, two or more of the following may be located within the enclosure: thermal management system, a control system, a bias capacitor, a bias compensation power supply, a second nanosecond pulser, a resistive output stage, or an energy recovery circuit. In some embodiments, the enclosure may have a volume less than about 1 m$^3$.

In some embodiments, a plurality of resistive output stage resistors may be coupled with each of the nanosecond pulsers. In some embodiments, a plurality of snubber resistors R3 may be coupled with each of the nanosecond pulsers. In some embodiments, various components may be slide mounted within the chassis.

In some embodiments, internal and slide-in modules may be connected with interconnect PCBs. In some embodiments, PCBs may allow for signals to be shielded between ground layers to minimize EMI effects. In some embodiments, a rigid design is used that may be optimal for placement/alignment of slide-in modules. In some embodiments, the modules may be screwed together and socket-style connections allow for modularity compared to cables or soldered connections.

In some embodiments, the peak electric field between any two components inside the enclosure may be less than about 20 MV/m.

Unless otherwise specified, the term "substantially" means within 5% or 10% of the value referred to or within manufacturing tolerances. Unless otherwise specified, the term "about" means within 5% or 10% of the value referred to or within manufacturing tolerances.

Figure 15:
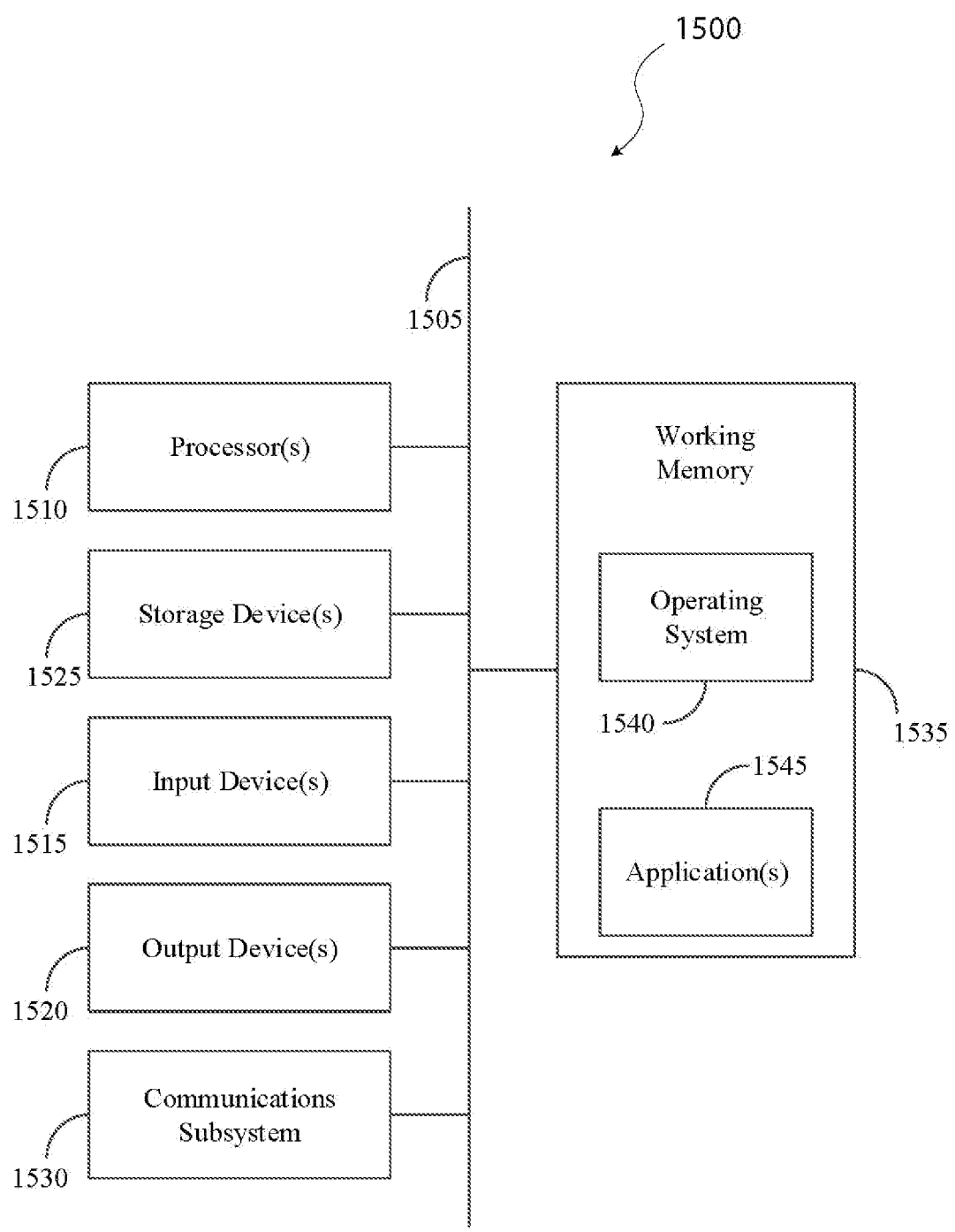
FIG. 15 shows an illustrative computational system for performing functionality to facilitate implementation of embodiments described herein.

The computational system 1500, shown in FIG. 15 can be used to perform any of the embodiments of the invention. As another example, computational system 1500 can be used to perform any calculation, identification and/or determination described here. The computational system 1500 includes hardware elements that can be electrically coupled via a bus 1505 (or may otherwise be in communication, as appropriate). The hardware elements can include one or more processors 1510, including without limitation one or more general-purpose processors and/or one or more special-purpose processors (such as digital signal processing chips, graphics acceleration chips, and/or the like); one or more input devices 1515, which can include without limitation a mouse, a keyboard and/or the like; and one or more output devices 1520, which can include without limitation a display device, a printer and/or the like.

The computational system 1500 may further include (and/or be in communication with) one or more storage devices 1525, which can include, without limitation, local and/or network accessible storage and/or can include, without limitation, a disk drive, a drive array, an optical storage device, a solid-state storage device, such as a random access memory ("RAM") and/or a read-only memory ("ROM"), which can be programmable, flash-updateable and/or the like. The computational system 1500 might also include a communications subsystem 1530, which can include without limitation a modem, a network card (wireless or wired), an infrared communication device, a wireless communication device and/or chipset (such as a Bluetooth device, an 802.6 device, a Wi-Fi device, a WiMax device, cellular communication facilities, etc.), and/or the like. The communications subsystem 1530 may permit data to be exchanged with a network (such as the network described below, to name one example), and/or any other devices described herein. In many embodiments, the computational system 1500 will further include a working memory 1535, which can include a RAM or ROM device, as described above.

The computational system 1500 also can include software elements, shown as being currently located within the working memory 1535, including an operating system 1540 and/or other code, such as one or more application programs 1545, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 1525 described above.

In some cases, the storage medium might be incorporated within the computational system 1500 or in communication with the computational system 1500. In other embodiments, the storage medium might be separate from a computational system 1500 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 1500 and/or might take the form of source and/or installable code, which, upon compilation and/or installation on the computational system 1500 (e.g., using any of a variety of generally available compilers, installation programs, compression/decompression utilities, etc.) then takes the form of executable code.

Numerous specific details are set forth herein to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A high voltage pulsing power supply comprising:
   a high voltage pulser having an output that provides pulses with an amplitude greater than about 1 kV, a pulse width less than about 1 µs, and a pulse repetition frequency greater than about 20 kHz;
   a plasma chamber;
   an electrode disposed within the plasma chamber that is electrically coupled with the output of the high voltage pulser to produce an electric field within the plasma chamber;
   at least two of the following a thermal management system, a control system, a bias capacitor, a bias compensation power supply, a second nanosecond pulser, and an energy recovery circuit that are disposed within an enclosure; and
   a resistive output stage that includes an inductor and a capacitor arranged in series, wherein the inductor has an inductance less than about 200 µH.

2. The high voltage pulsing power supply according to claim 1, further comprising the thermal management subsystem comprising one or more switch cold plates and one or more transformer core cold plates, wherein the high voltage pulser comprises a plurality of switches coupled with the one or more switch cold plates and a transformer coupled with the one or more transformer core cold plates.

3. The high voltage pulsing power supply according to claim 2, wherein the thermal management subsystem comprises a fluid that flows through the switch cold plates and the core cold plates.

4. The high voltage pulsing power supply according to claim 1, wherein the control system measures the voltage of the output pulses.

5. The high voltage pulsing power supply according to claim 1, further comprising:
   said bias compensation power supply electrically coupled with the high voltage pulser and the electrode, wherein the bias compensation power supply produces a voltage across the bias capacitor.

6. The high voltage pulsing power supply according to claim 1, wherein the resistive output stage is electrically coupled with the high voltage pulser and the electrode and removes charge from a load at fast time scales.

7. The high voltage pulsing power supply according to claim 1,
wherein the enclosure has a volumetric dimension of less than 1 m³, wherein the high voltage pulser is disposed within the enclosure.

8. The high voltage pulsing power supply according to claim 1, wherein the energy recovery circuit is electrically coupled with the high voltage pulser and the electrode and removes charge from a load at fast time scales.

9. The high voltage pulsing power supply according to claim 1, wherein the control system is electrically coupled with the high voltage pulser and produces a low voltage signal that controls the pulse width and the pulse repetition frequency of the output pulses.

10. The high voltage pulsing power supply according to claim 1, further comprising:
a second high voltage pulser having an output that provides pulses with an amplitude greater than about 1 kV, a pulse width less than about 1 µs, and a pulse repetition frequency greater than about 20 kHz; and
a second electrode disposed within the plasma chamber that is electrically coupled with the output of the second high voltage pulser to produce a pulsing an electric field within the plasma chamber near the second electrode
wherein an inductance between the output of the high voltage pulser and at the electrode is less than about 10 µH; and
wherein the capacitance between the output of the high voltage pulser and ground is less than about 10 nF.

11. The high voltage pulsing power supply according to claim 10, wherein the pulses from the high voltage pulser and the pulses from the second high voltage pulser differ in at least one of voltage, pulse width, and pulse repetition frequency.

12. The high voltage pulsing power supply according to claim 1, wherein the peak electric field between any two components inside the enclosure is less than about 20 MV/m.

13. A high voltage pulsing power supply comprising:
a high voltage pulser having an output that provides pulses with an amplitude greater than about 1 kV, a pulse width less than about 1 µs, and a pulse repetition frequency greater than about 20 kHz, wherein the high voltage pulser comprises:
a plurality of switches; and
a transformer coupled with the plurality of switches and the output, and having a transformer core;
a plasma chamber;
an electrode disposed within the plasma chamber that is electrically coupled with the output of the high voltage pulser to produce an electric field within the plasma chamber; and
a control module electrically coupled with the high voltage pulser, the control module measures the voltage of the pulses at the electrode and the control module modifies at least one of the voltage, pulse width, and pulse repetition frequency of the pulses in response to the measured voltage;
wherein the high voltage pulser comprises:
a thermal management subsystem comprising a plurality of cold plates coupled with the high voltage pulser;
wherein the plurality of cold plates comprise:
one or more switch cold plates coupled with the plurality of switches; and
one or more transformer core cold plates coupled with the transformer core;
wherein the thermal management subsystem comprises a fluid that flows through at least one of the plurality of cold plates.

14. The high voltage pulsing power supply according to claim 13, wherein the control module measures one or more parameters of the thermal management subsystem and stops the high voltage pulser from outputting pulses in the event one of the one or more parameters is out of tolerance.

15. A high voltage pulsing power supply comprising:
a high voltage pulser having an output that provides pulses with an amplitude greater than about 1 kV, a pulse width less than about 1 µs, and a pulse repetition frequency greater than about 20 kHz;
a plasma chamber;
an electrode disposed within the plasma chamber that is electrically coupled with the output of the high voltage pulser to produce an electric field within the plasma chamber;
wherein an inductance between the output of the high voltage pulser and at the electrode is less than about 10 µH; and
wherein a capacitance between the output of the high voltage pulser and ground is less than about 10 nF.

16. The high voltage pulsing power supply according to claim 15, further comprising a control system that measures the voltage of the output pulses.

17. The high voltage pulsing power supply according to claim 15, further comprising:
a bias compensation power supply electrically coupled with the high voltage pulser and the electrode, wherein the bias compensation power supply produces a voltage across a bias capacitor.

18. The high voltage pulsing power supply according to claim 15, further comprising a resistive output stage that is electrically coupled with the high voltage pulser and the electrode and removes charge from a load at fast time scales.

19. The high voltage pulsing power supply according to claim 15, further comprising an energy recovery circuit that is electrically coupled with the high voltage pulser and the electrode and removes charge from a load at fast time scales.

20. The high voltage pulsing power supply according to claim 15, further comprising a control system that is electrically coupled with the high voltage pulser and produces a low voltage signal that controls the pulse width and the pulse repetition frequency of the output pulses.

\* \* \* \* \*